US011871684B2

(12) United States Patent
Han

(10) Patent No.: US 11,871,684 B2
(45) Date of Patent: Jan. 9, 2024

(54) SEMICONDUCTOR DEVICE INCLUDING RESISTANCE CHANGING LAYER AND METHOD OF MANUFACTURING THE SAME

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 347 days.

(21) Appl. No.: 17/391,444

(22) Filed: Aug. 2, 2021

(65) Prior Publication Data

US 2022/0140234 A1 May 5, 2022

(30) Foreign Application Priority Data

Nov. 2, 2020 (KR) ........................ 10-2020-0144704

(51) Int. Cl.
*H10N 70/20* (2023.01)
*H10N 70/00* (2023.01)

(52) U.S. Cl.
CPC ........... *H10N 70/253* (2023.02); *H10N 70/24* (2023.02); *H10N 70/826* (2023.02); *H10N 70/8413* (2023.02)

(58) Field of Classification Search
CPC ............................... H10N 70/00; H10N 70/20
See application file for complete search history.

(56) References Cited

U.S. PATENT DOCUMENTS

2015/0255511 A1 9/2015 Takagi et al.

FOREIGN PATENT DOCUMENTS

KR 10-2014-0127577 A 11/2014

*Primary Examiner* — Marvin Payen

(57) ABSTRACT

A semiconductor device includes a substrate and a gate structure disposed over the substrate. The gate structure includes at least one gate electrode layer and at least one interlayer insulating layer that are alternately stacked over the substrate. The semiconductor device includes a hole pattern penetrating the gate structure over the substrate, and a gate insulating layer, a channel layer, a resistor layer, and a resistance changing layer sequentially disposed on a sidewall surface of the gate structure within the hole pattern. Each of the resistor layer and the resistance changing layer is disposed opposite to the gate insulating layer, based on the channel layer.

20 Claims, 28 Drawing Sheets

1

11
123
I
I'
122
121
120
110
102
101
z
y
x

SEMICONDUCTOR DEVICE INCLUDING RESISTANCE CHANGING LAYER AND METHOD OF MANUFACTURING THE SAME

CROSS-REFERENCE TO RELATED APPLICATIONS

The present application claims priority under 35 U.S.C. § 119(a) to Korean Application No. 10-2020-0144704, filed on Nov. 2, 2020 in the Korean Intellectual Property Office, which is incorporated herein by reference in its entirety.

BACKGROUND

1. Technical Field

The present disclosure generally relates to a semiconductor device and, more particularly, to a semiconductor device including a resistance changing layer and a method of manufacturing the same.

2. Related Art

Recently, semiconductor devices having a three-dimensional structure have been developed from semiconductor devices with planar structures. A semiconductor device having a three-dimensional structure has advantages in addressing the requests for a decrease in design rules and an increase in integration degree in the industry. In particular, in the field of memory devices requiring high integration and high capacity, research on three-dimensional structures is being actively conducted.

SUMMARY

A semiconductor device according to an embodiment of the present disclosure may include a substrate, and a gate structure disposed over the substrate. The gate structure may include at least one gate electrode layer and at least one interlayer insulating layer that are alternately stacked over the substrate. The semiconductor device may include a hole pattern penetrating the gate structure over the substrate, a gate insulating layer, a channel layer, a resistor layer, and a resistance changing layer that are sequentially disposed on a sidewall surface of the gate structure within the hole pattern. Each of the resistor layer and the resistance changing layer is disposed opposite to the gate insulating layer, based on the channel layer.

A semiconductor device according to another embodiment of the present disclosure may include a substrate, and a gate structure disposed over the substrate. The gate structure may include at least one gate electrode layer and at least one interlayer insulating layer that are alternately stacked over the substrate along a first direction perpendicular to the substrate, and the gate structure may extend in a second direction perpendicular to the first direction. The semiconductor device may include a gate insulating layer, a channel layer, a resistor layer, and a resistance changing layer sequentially disposed on a sidewall surface of the gate structure over the substrate. Each of the resistor layer and the resistance changing layer is disposed opposite to the gate insulating layer, based on the channel layer.

According to another embodiment of the present disclosure, there is provided a method of manufacturing a semiconductor device. In the method, a substrate may be provided. A gate structure may be formed over the substrate. The gate structure may include at least one gate electrode layer and at least one interlayer insulating layer that are alternately stacked over the substrate. A hole pattern may be formed to penetrate the gate structure over the substrate. A gate insulating layer, a channel layer, and an oxidation reaction layer may be sequentially formed on a sidewall surface of the gate structure in the hole pattern. A reduction reaction layer may be formed on the oxidation reaction layer. A resistor layer, a resistance changing layer, and an insulating layer may be formed by reacting the oxidation reaction layer and the reduction reaction layer.

According to another embodiment of the present disclosure, there is provided a method of manufacturing a semiconductor device. In the method, a substrate may be provided. A gate structure may be formed over the substrate. The gate structure may include at least one gate electrode layer and at least one interlayer insulating layer that are alternately stacked over the substrate. A hole pattern may be formed to penetrate the gate structure over the substrate. A gate insulating layer and a channel formation layer may be sequentially formed on a sidewall surface of the gate structure in the hole pattern. A reduction reaction layer may be formed on the channel formation layer. A channel layer, a resistor layer, a resistance changing layer, and an insulating layer may be formed by reacting the channel formation layer and the reduction reaction layer.

According to yet another embodiment of the present disclosure, there is provided a method of manufacturing a semiconductor device. In the method, a substrate may be provided. A gate structure may be formed over the substrate and extend in a direction parallel to a surface of the substrate may be formed. The gate structure may include at least one gate electrode layer and at least one interlayer insulating layer that are alternately stacked in a direction perpendicular to the surface of the substrate. A gate insulating layer, a channel layer, and an oxidation reaction layer may be sequentially formed on a sidewall surface of the gate structure over the substrate. A reduction reaction layer may be formed on the oxidation reaction layer. A resistor layer, a resistance changing layer, and an insulating layer may be formed by reacting the oxidation reaction layer and the reduction reaction layer.

According to still yet another embodiment of the present disclosure, there is provided a method of manufacturing a semiconductor device. In the method, a substrate may be provided. A gate structure may be formed over the substrate and extend in a direction parallel to a surface of the substrate may be formed. The gate structure may include at least one gate electrode layer and at least one interlayer insulating layer that are alternately stacked in a direction perpendicular to the surface of the substrate. A gate insulating layer and a channel formation layer may be sequentially formed on a sidewall surface of the gate structure over the substrate. A reduction reaction layer may be formed on the channel formation layer. A channel layer, a resistor layer, a resistance changing layer, and an insulating layer may be formed by reacting the channel formation layer and the reduction reaction layer.

DETAILED DESCRIPTION

Figure 1:
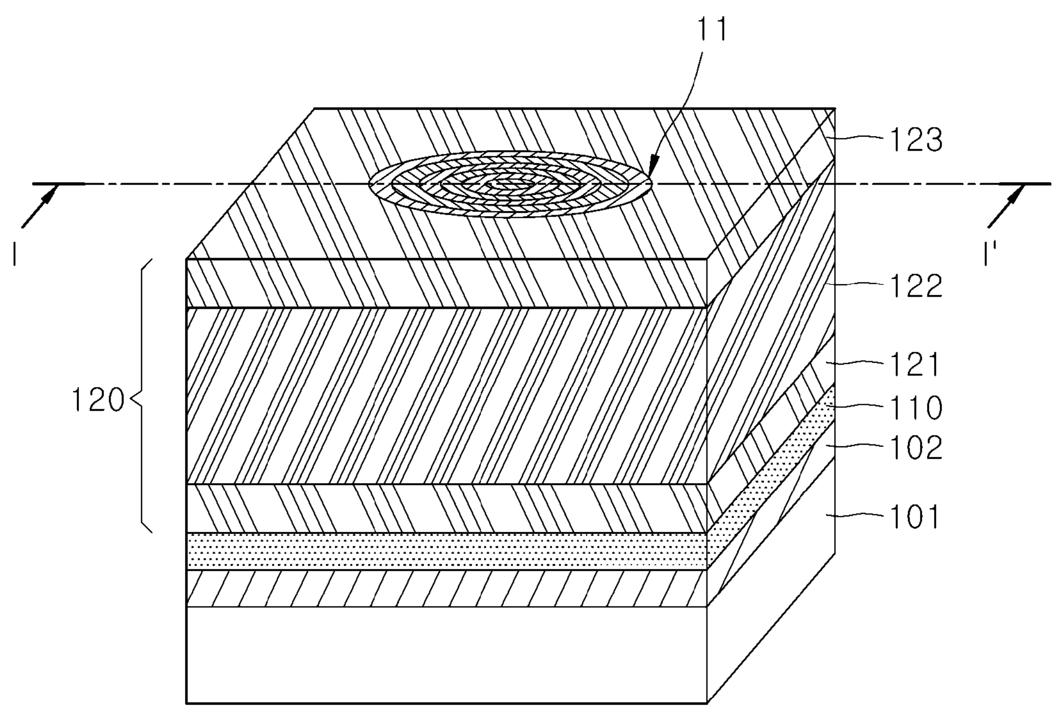
FIG. 1 is a perspective view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms “comprise,” “include,” or “have” are intended to specify the presence of a feature, a number, a step, an operation, a component, an element, a part, or combinations thereof, but not used to preclude the presence or possibility of adding one or more other features, numbers, steps, operations, components, elements, parts, or combinations thereof.

In this specification, the phrase “a predetermined direction” may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

Figure 2:
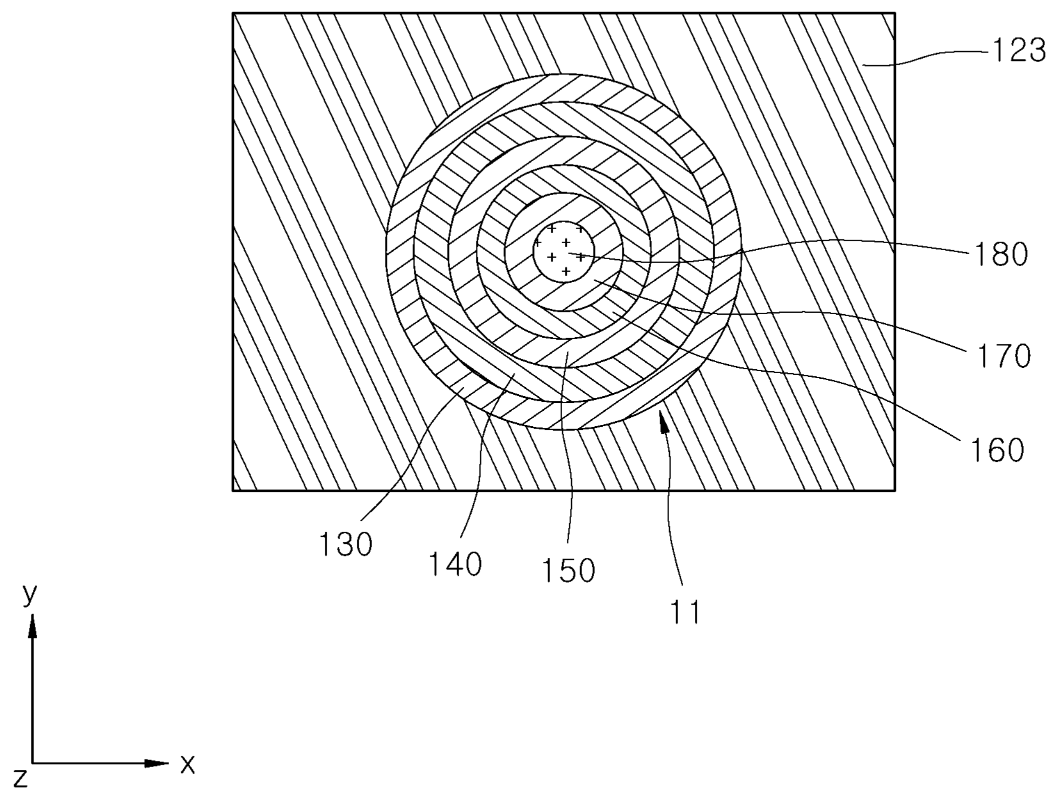
FIG. 2 is a plan view of a semiconductor device of FIG. 1.
Figure 3:
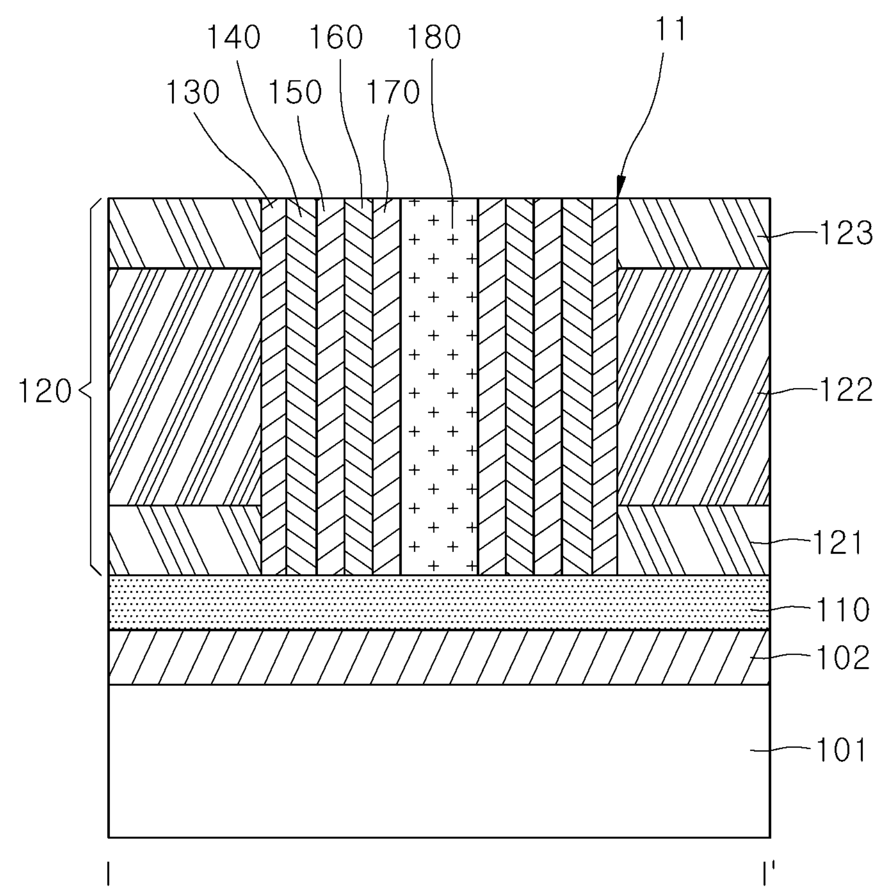
FIG. 3 is a cross-sectional view taken along line I-I' of the semiconductor device of FIG. 1.

FIG. 1 is a perspective view schematically illustrating a semiconductor device according to an embodiment of the present disclosure. FIG. 2 is a plan view of a semiconductor device of FIG. 1. FIG. 3 is a cross-sectional view taken along line I-I' of the semiconductor device of FIG. 1.

Referring to FIGS. 1 to 3, a semiconductor device 1 includes a substrate 101 and a gate structure 120 disposed over the substrate 101. In addition, the semiconductor device 1 includes a hole pattern 11 penetrating the gate structure 120 over the substrate 101. The semiconductor device 1 includes a gate insulating layer 130, a channel layer 140, a resistor layer 150, and a resistance changing layer 160 which are sequentially disposed on a sidewall surface of the gate structure 120 within the hole pattern 11. The semiconductor device 1 may further include an insulating layer 170 disposed inside the hole pattern 11 to contact the resistance changing layer 160. In addition, the semiconductor device 1 may further include a filling layer 180 that is disposed to contact the insulating layer 170 and to fill the hole pattern 11. The gate structure 120 may include a lower interlayer insulating layer 121, a gate electrode layer 122, and an upper interlayer insulating layer 123.

Referring to FIGS. 1 to 3, the substrate 101 may include a semiconductor material. Specifically, the semiconductor material may include silicon (Si), germanium (Ge), gallium arsenide (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. The semiconductor material may be doped with a dopant. As an example, the semiconductor material may be doped with an N-type dopant or a P-type dopant.

A base insulating layer 102 may be disposed on the substrate 101. The base insulating layer 102 may include an insulating material. The insulating material may include, for example, oxide, nitride, oxynitride, or a combination of two or more thereof.

A channel lower contact layer 110 may be disposed on the base insulating layer 102. The channel lower contact layer 110 may be electrically connected to an end of the channel layer 140. The channel lower contact layer 110 may be connected to a source line (not illustrated). The channel lower contact layer 110 may provide the potential of the source line to the channel layer 140. In some embodiments, the source line may be disposed on the gate structure 120. In such instances, the source electrode may be electrically connected to the channel lower contact layer 110 through a conductive via that penetrates the gate structure 120 and contacts the channel lower contact layer 110.

The channel lower contact layer 110 may include a conductive material. The conductive material may include, for example, a doped semiconductor, metal, conductive metal nitride, conductive metal carbide, conductive metal silicide, or conductive metal oxide. The conductive material may include, for example, silicon doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 120 may be disposed on the channel lower contact layer 110. The gate structure 120 may include the lower interlayer insulating layer 121, the gate electrode layer 122, and the upper interlayer insulating layer 123, which are sequentially disposed over the substrate 101. The lower interlayer insulating layer 121 may be disposed to contact the channel lower contact layer 110. The lower interlayer insulating layer 121 may electrically insulate the gate electrode layer 122 and the channel lower contact layer 110 from each other. Similarly, the upper interlayer insulating layer 123 may electrically insulate the gate electrode layer 122 from a conductive layer (not illustrated) on the upper interlayer insulating layer 123.

The gate electrode layer 122 may include a conductive material. The conductive material may include, for example, a doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Each of the lower interlayer insulating layer 121 and the upper interlayer insulating layer 123 may include an insulating material. The insulating material may include, for example, oxide, nitride, oxynitride, or a combination of two or more thereof.

Referring to FIGS. 1 to 3, the hole pattern 11 penetrating the gate structure 120 is formed on the channel lower contact layer 110. As an example, the hole pattern 11 may be formed by lithography and etching processes.

Referring to FIGS. 1 and 3, inside the hole pattern 11, the gate insulating layer 130 may be disposed on a sidewall surface of the gate structure 120. The gate insulating layer 130 may be disposed to cover a sidewall surface of the gate structure 120. The gate insulating layer 130 may include, for example, oxide, nitride, oxynitride, or a combination of two or more thereof.

The channel layer 140 may be disposed on the gate insulating layer 130. An end of the channel layer 140 may be in contact with the channel lower contact layer 110. The channel layer 140 may include a semiconductor material. The semiconductor material may include, for example, silicon (Si), germanium (Ge), gallium arsenide (GaAs), or the like. As another example, the semiconductor material may include a 2D semiconductor material. The 2D semiconductor material may include transition metal dichalcogenide (TMDC) or black phosphorus. The transition metal dichalcogenide may include, for example, molybdenum selenide ($MoSe_2$), hafnium selenide ($HfSe_2$), indium selenide (InSe), gallium selenide (GaSe), and the like. The semiconductor material may include, for example, a metal oxide such as indium-gallium-zinc oxide (IGZO).

The resistor layer 150, the resistance changing layer 160, and the insulating layer 170 may be sequentially disposed on a sidewall surface of the channel layer 140. The resistor layer 150 may be disposed to cover the channel layer 140. The resistance changing layer 160 may be disposed to cover the resistor layer 150. The insulating layer 170 may be disposed to cover the resistance changing layer 160. Each of the resistor layer 150, the resistance changing layer 160, and the insulating layer 170 may be disposed on a side of the channel layer 140 opposite to another side of the channel layer 140 in contact with the gate insulating layer 130.

The resistor layer 150 may have invariable, or fixed, resistivity. While a resistance of the resistance changing layer 160 may be changed by the application of an external electric field, a resistance of the resistor layer 150 might not be changed by the application of an external electric field. The resistor layer 150 may include an oxide material having a predetermined electrical resistance. The oxide material may include, for example, silicon oxide or aluminum oxide. The oxide material may satisfy a stoichiometric ratio of silicon (Si) and oxygen (O) or a stoichiometric ratio of aluminum (Al) and oxygen (O). That is, the resistor layer 150 might not contain oxygen vacancies, or may have a sufficiently low oxygen vacancy concentration, compared to the resistance changing layer 160. The sufficiently low oxygen vacancy concentration may refer to a concentration in which no change in the distribution of the oxygen vacancy present in the resistor layer 150 can change the electrical resistance state of the resistor layer 150. The resistor layer 150 may have a thickness of 1 nm to 5 nm, as an example.

The resistance changing layer 160 may be disposed to cover a sidewall surface of the resistor layer 150. The resistance changing layer 160 may include oxygen vacancies that can move along an electric field when an electric field having a magnitude greater than or equal to a threshold value is applied to the resistance changing layer 160. That is, the electric field may change the distribution of oxygen vacancies in the resistance changing layer 160.

The resistance changing layer 160 may have different electrical resistance states according to the distribution of the oxygen vacancies. As an example, when the oxygen vacancies are uniformly distributed in the resistance changing layer 160, the resistance changing layer 160 may maintain a high resistance state. As another example, when the oxygen vacancies are densely distributed in one direction under an applied electric field, the resistance changing layer 160 may have a low resistance state in which the resistance is reduced or lower compared to the high resistance state.

The resistance changing layer 160 may non-volatilely retain a resistance state that was changed by the application of an electric field, even after the electric field is removed. Accordingly, the resistance changing layer 160 may function as a memory layer that stores the resistance state as signal information.

The resistance changing layer 160 may include metal oxide. The resistance changing layer 160 includes a non-stoichiometric metal oxide. The metal oxide may have an unbalanced stoichiometric ratio of lower oxygen content to the metal in the metal oxide. That is, the metal oxide may have an insufficient amount of oxygen to the metal in the metal oxide. For this reason, the metal oxide may have a concentration of oxygen vacancies that corresponds to the insufficient oxygen content. The metal oxide may include, for example, lithium oxide, titanium oxide, nickel oxide, copper oxide, manganese oxide, hafnium oxide, zirconium oxide, tungsten oxide, niobium oxide, vanadium oxide, or a combination of two or more thereof.

In an embodiment, the resistance changing layer 160 may include the same metal oxide as the insulating layer 170. However, the metal oxide of the resistance changing layer 160 may have a lower oxygen content than the metal oxide of the insulating layer 170. Due to the lower oxygen content, the resistance changing layer 160 may have a higher oxygen vacancy concentration than the insulating layer 170.

In some embodiments, the resistance changing layer 160 may further include an impurity that can be bonded to oxygen. As an example, the impurity may include silicon (Si) or aluminum (Al). The impurity may have a greater affinity for oxygen than the metal in the metal oxide of the resistance changing layer 160. Accordingly, the impurity may reduce the metal oxide of the resistance changing layer 160. Oxygen vacancies may be generated in the metal oxide through reduction of the metal oxide by the impurities, which are distributed in the resistance changing layer 160. Accordingly, the concentration of the oxygen vacancies in the resistance changing layer 160 may be additionally increased.

The insulating layer 170 may be disposed to cover a sidewall surface of the resistance changing layer 160. The insulating layer 170 may have electrical insulation properties. In an embodiment, the insulating layer 170 may include the same metal oxide as the resistance changing layer 160. However, the metal oxide of the insulating layer 170 may have a higher oxygen content than the metal oxide of the resistance changing layer 160.

In an embodiment, compared to the resistance changing layer 160, the insulating layer 170 may have a low oxygen vacancy concentration that does not support a change in an internal electrical resistance state. In an embodiment, the metal oxide of the insulating layer 170 may satisfy a stoichiometric ratio between the oxygen and the metal of the metal oxide.

Referring to FIGS. 1 to 3 again, the filling layer 180 may be disposed inside the hole pattern 11 in which the gate insulating layer 130, the channel layer 140, the resistor layer 150, the resistance changing layer 160, and the insulating layer 170 are formed. The filling layer 180 may include, for example, oxide, nitride, oxynitride, or a combination of two or more thereof. The filling layer 180 may contact the insulating layer 170 inside the hole pattern 11. Although not illustrated in FIGS. 1 to 3, a channel upper contact layer in contact with one end of the channel layer 140 may be disposed outside of the hole pattern 11. The channel upper contact layer may electrically connect the channel layer 140 to a bit line (not illustrated). Although not illustrated in FIGS. 1 to 3, the bit line may be disposed on the gate structure 120 in a form of a conductive line pattern and may be electrically connected to the channel upper contact layer. The bit line may provide an electric potential of the bit line to the channel layer 140 through the channel upper contact layer.

In some other embodiments, the insulating layer 170 may be omitted in the semiconductor device 1 of FIGS. 1 to 3, and the filling layer 180 may be disposed to contact the resistance changing layer 160.

Figure 4A:
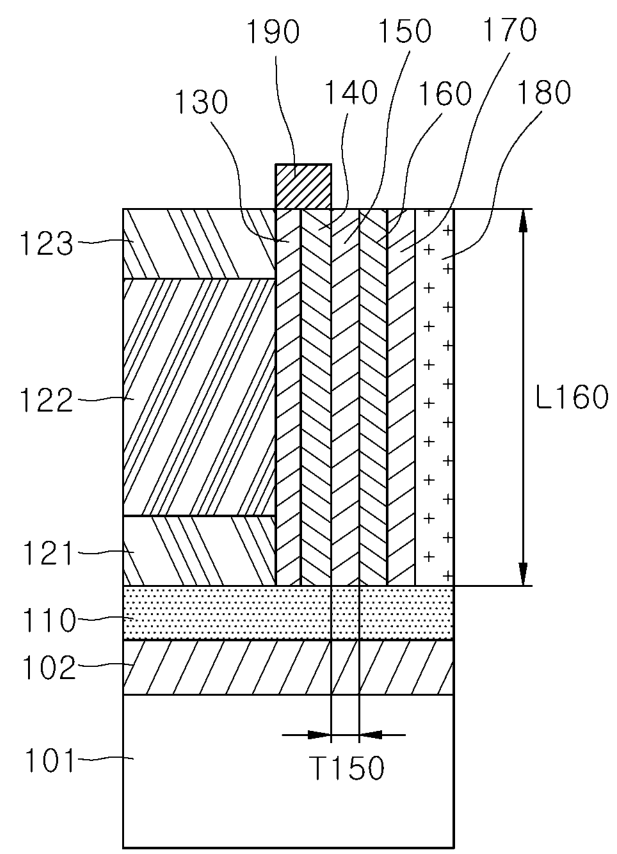
FIGS. 4A and 4B are views schematically illustrating a method of operating a semiconductor device according to an embodiment of the present disclosure.
Figure 4B:
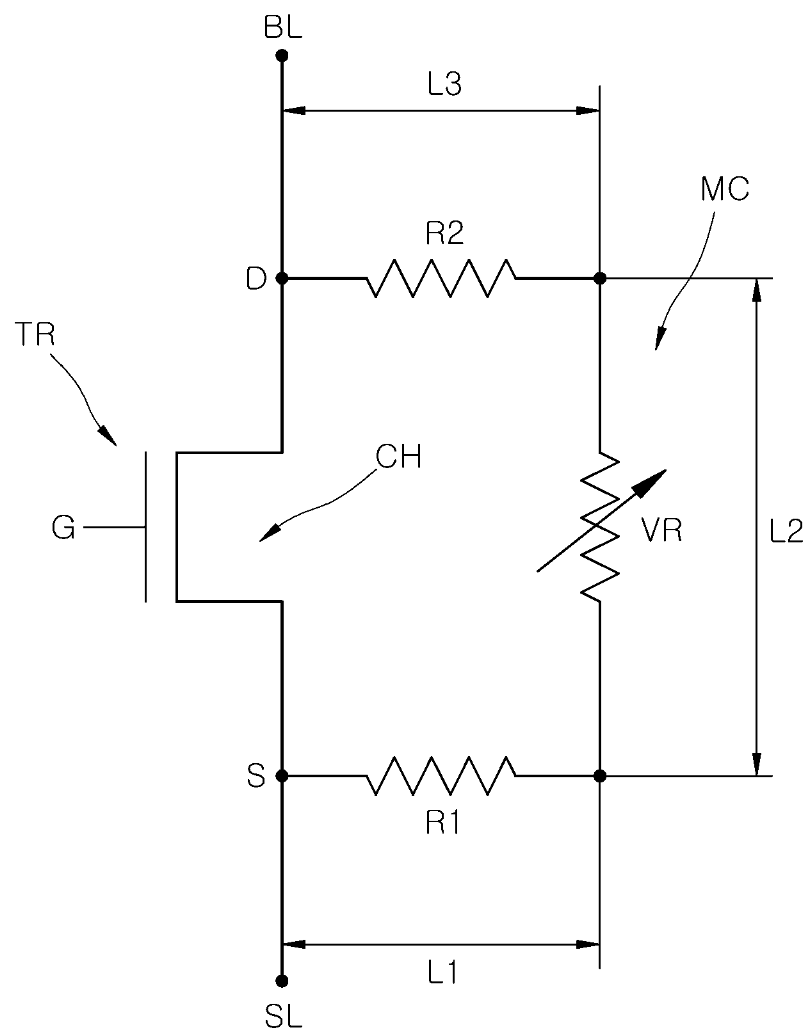
Figure 5:
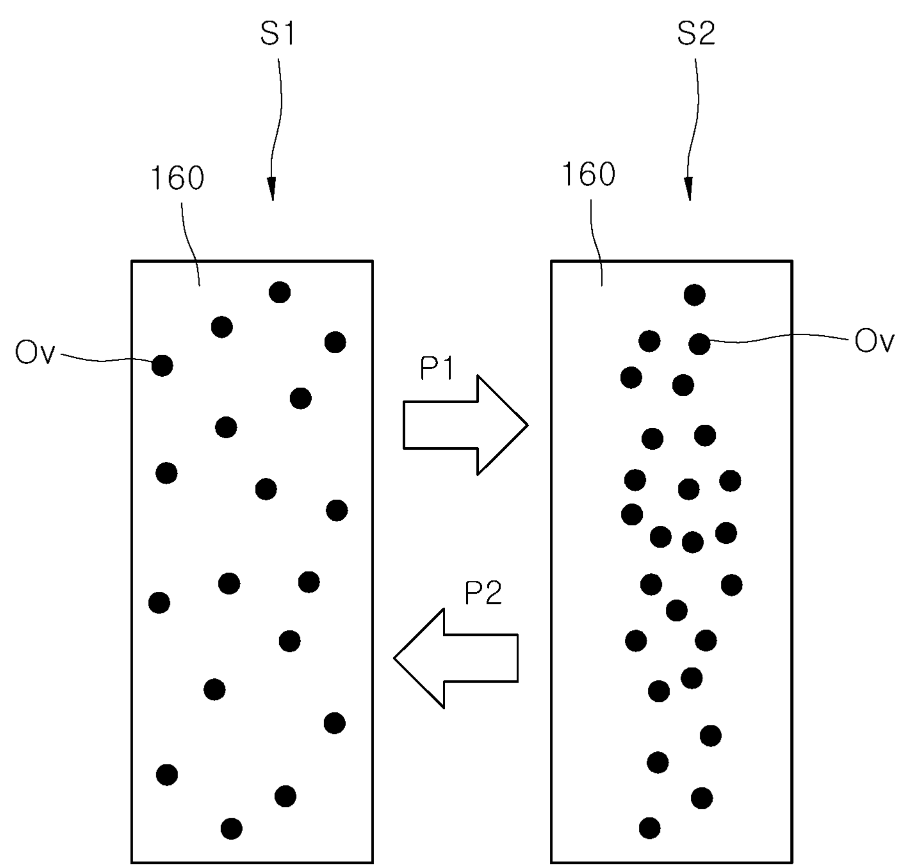
FIG. 5 is a view illustrating a change in oxygen vacancies in a resistance changing layer of a semiconductor device according to an embodiment of the present disclosure.

FIGS. 4A and 4B are views schematically illustrating a method of operating a semiconductor device according to an embodiment of the present disclosure. Specifically, FIG. 4A is a schematic illustration of a semiconductor device 1 of FIG. 1 and illustrates a portion of the cross-sectional view of FIG. 3. FIG. 4B is a circuit diagram of a semiconductor device 1. FIG. 5 is a view illustrating a change in oxygen vacancies in a resistance changing layer of the semiconductor device according to an embodiment of the present disclosure.

FIG. 4A is a schematic illustration of a memory cell MC in the circuit diagram of FIG. 4B. In FIG. 4A, the ends of the channel layer 140 are in contact with a channel lower contact layer 110 and a channel upper contact layer 190. The channel lower contact layer 110 and the channel upper contact layer 190 may be electrically connected to the source line (not illustrated) and the bit line (not illustrated), respectively. The source line and the bit line may correspond to the source line SL and the bit line BL of FIG. 4B. The channel layer 140, the gate insulating layer 130, and the gate electrode layer 122 of FIG. 4A may constitute a transistor TR of FIG. 4B having a source S, a drain D, a channel CH, and a gate G. The source S and the drain D may be connected to the source line SL and the bit line BL, respectively. The gate electrode layer 122 of FIG. 4A may correspond to the gate G of the transistor TR of FIG. 4B, and the conductive channel formed in the channel layer 140 of FIG. 4A may correspond to the channel CH of the transistor TR of FIG. 4B.

In FIG. 4A, the resistor layer 150 having a thickness T150 in the x-direction may correspond to a first and second fixed resistance R1 and R2 in FIG. 4B disposed in a first and third electric path L1 and L3, respectively. In FIG. 4A, the resistance changing layer 160 having a length L160 in the z-direction may correspond to the variable resistance VR in FIG. 4B disposed in the second electric path L2. In FIG. 4B, the first to third electric paths L1, L2, and L3 may be connected in parallel with the transistor TR.

An operating method of a semiconductor device according to an embodiment of the present disclosure will be described with reference to FIGS. 4A, 4B and 5. Referring to FIG. 5, the resistance changing layer 160 of a semiconductor device may include oxygen vacancies Ov. As will be described later with reference to FIG. 7, a semiconductor device may be manufactured with an amount of oxygen vacancies in the resistance changing layer 160 that is sufficient to permit changes in the resistance state or to allow set and reset operations. Accordingly, it may not be necessary to perform a forming operation for generating oxygen vacancies during the initial operation of a semiconductor device of the present disclosure. The forming operation may refer to an operation of applying a high electric field to a resistance changing layer to generate oxygen vacancies inside the resistance changing layer and to convert a resistance state of the resistance changing layer into a low resistance state using the oxygen vacancies generated inside the resistance changing layer during a conventional resistance change memory operation. The oxygen vacancies generated in the resistance changing layer 160 when manufactured may be enough for use in subsequent set and reset operations.

In a conventional application, when a transition metal oxide is utilized in a resistance changing layer, a forming operation is first performed on the transition metal oxide during the initial operation of the semiconductor device. By separating oxygen from the transition metal oxide through the forming operation, oxygen vacancies may be generated in the transition metal oxide. In contrast, in an embodiment of the present disclosure, the resistance changing layer 160 may include a sufficient amount of oxygen vacancies for use in set and reset operations without the forming operation.

Referring to FIG. 5, in an initial state S1, oxygen vacancies Ov may be uniformly distributed in the resistance changing layer 160 such that the resistance changing layer 160 may be in a high resistance state. Subsequently, a set operation P1 may be performed while applying a set electric field in the z-direction. As the oxygen vacancies Ov inside the resistance changing layer 160 move along the set electric field, the density of the oxygen vacancies Ov may increase locally along the direction of the set electric field. As the oxygen vacancies Ov are increasingly densely re-distributed along the application direction of the set electric field, the resistance of the resistance changing layer 160 decreases.

In addition, the density of the oxygen vacancies Ov in the resistance changing layer 160 along the direction of the set electric field may increase in proportion to the magnitude of the applied set electric field. As the density of the oxygen vacancies Ov increases, the resistance of the resistance changing layer 160 may decrease. Accordingly, by controlling the oxygen vacancies Ov to have various distribution densities that result from application of the set electric field, the resistance changing layer 160 may have a plurality of resistance states. Even after the applied set electric field is removed, the resistance changing layer 160 may maintain any one of multiple resistance states. Accordingly, the resistance changing layer 160 may have multiple levels of resistance states, which may be implemented as signal information.

Referring to FIG. 5, as a result of a set operation P1, the resistance changing layer 160 converts to and maintains a low resistance state, after which a reset operation P2 may be performed while applying a reset electric field in a direction opposite to the direction of the set electric field. During the reset operation P2, the density of the oxygen vacancies Ov in the resistance changing layer 160 along the direction of the reset electric field may decrease. As a result, the resistance state of the resistance changing layer 160 may be converted from the low resistance state to a high resistance state. The high resistance state of resistance changing layer 160 may be retained after the applied reset electric field is removed.

Referring to FIG. 4B, the set operation P1 may be performed by applying a set voltage between the source line SL and the bit line BL while the transistor TR is turned off using the gate electrode G. As an example, the process of applying the set voltage may be performed by applying a bias having a positive polarity to the bit line BL and grounding the source line SL. Meanwhile, because the transistor TR is in a turned-off state when the set voltage is applied, the current by the set voltage may flow along the first, second, and third electrical paths L1, L2, and L3, which provide a relatively low resistance path.

A set electric field formed at both ends of the variable resistor VR by the set voltage may have a direction from the bit line BL to the source line SL. The set electric field may convert the resistance state of the variable resistor VR from a high resistance state to a low resistance state. As described above, the set electric field may decrease the resistance of the variable resistor VR by increasing the density of oxygen vacancies inside the variable resistor VR along the direction of the set electric field.

Meanwhile, the reset operation P2 may be performed by applying a reset voltage between the source line SL and the bit line BL while the transistor TR is turned off using the gate G. As an example, the process of applying the reset voltage may be performed by applying a bias having a negative polarity to the bit line BL and grounding the source line SL. Since the transistor TR is turned off when the reset voltage is applied, the current by the reset voltage may flow along the first, second, and third electric paths L1, L2, and L3, which maintain a relatively low resistance.

A reset electric field formed at both ends of the variable resistor VR by the reset voltage may have a direction from the source line SL to the bit line BL. The reset electric field may convert the resistance state of the variable resistor VR from a low resistance state to a high resistance state. As described above, the reset electric field may increase the resistance of the variable resistor VR by reducing the density of oxygen vacancies inside the variable resistor VR along the direction of the reset electric field.

Figure 6A:
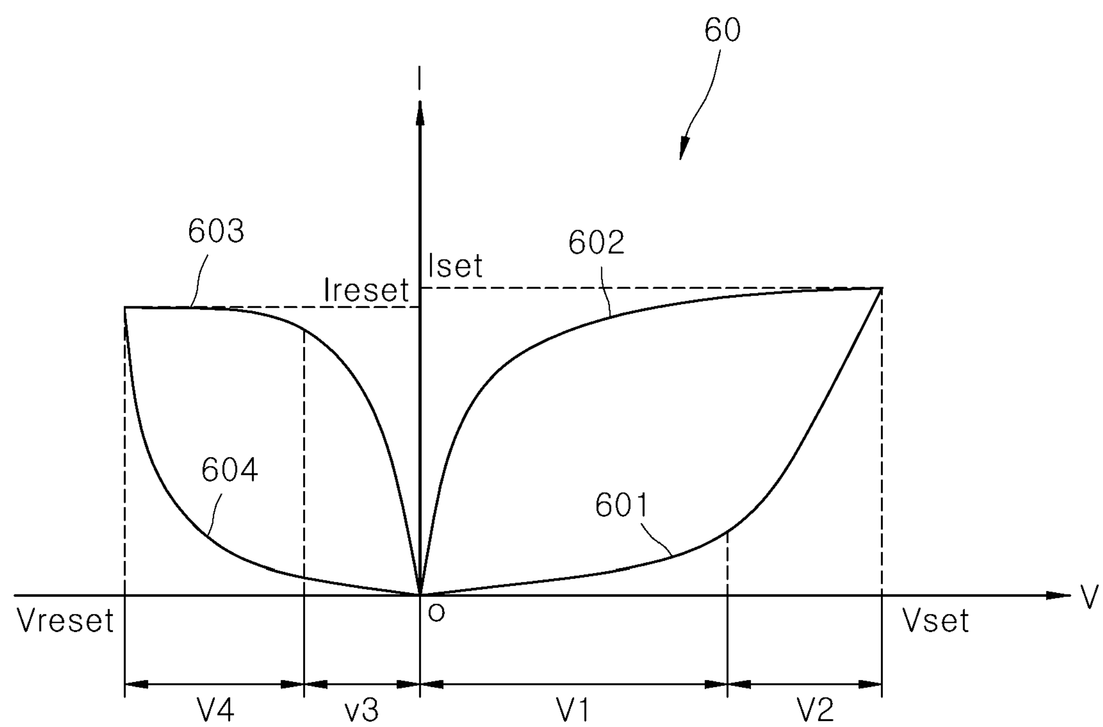
FIG. 6A is a graph schematically illustrating I-V characteristics of a semiconductor device according to an embodiment of the present disclosure.
Figure 6B:
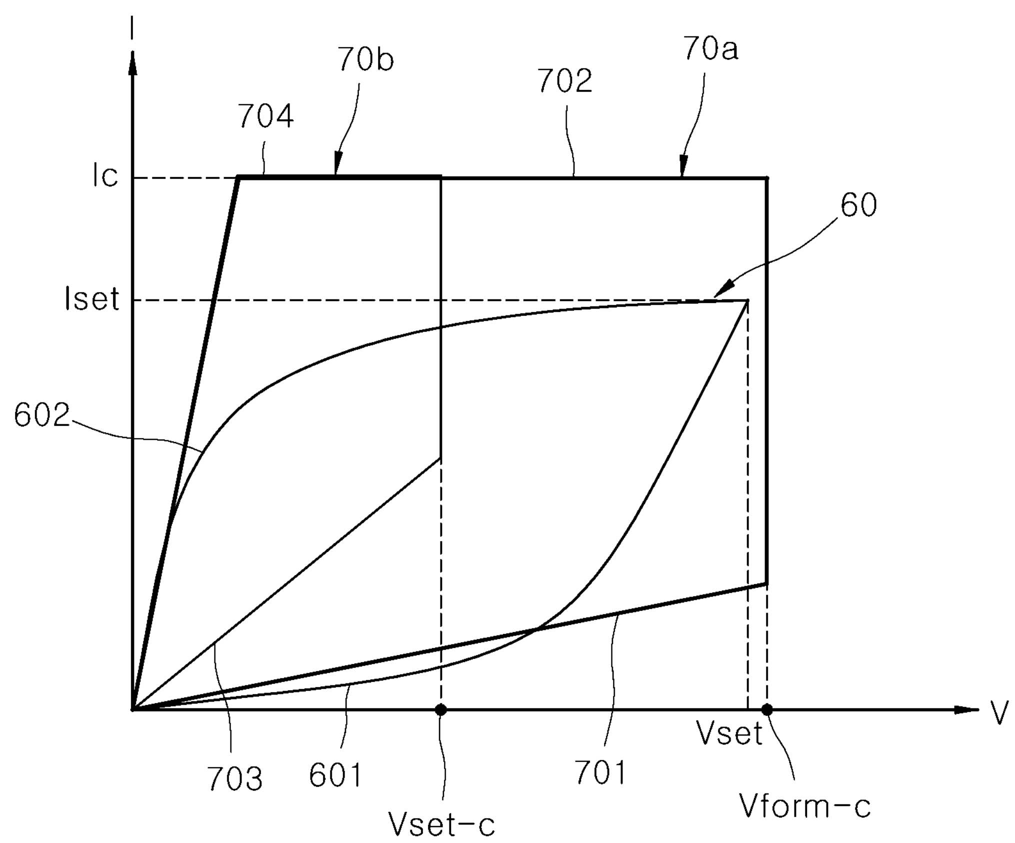
FIG. 6B is a graph comparing I-V characteristics of a conventional semiconductor device and a semiconductor device according to an embodiment of the present disclosure.
Figure 6C:
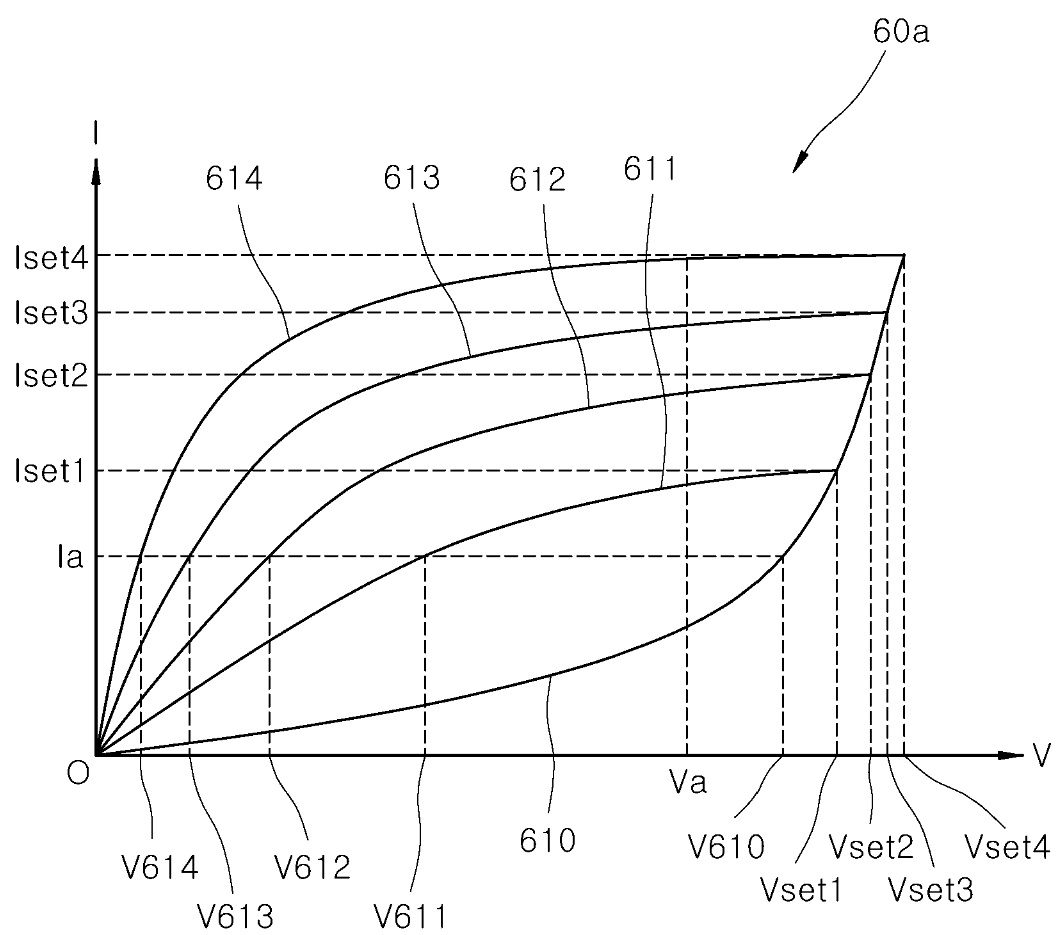
FIG. 6C is a graph schematically illustrating a method of implementing a multilevel signal in a semiconductor device according to an embodiment of the present disclosure.
Figure 6D:
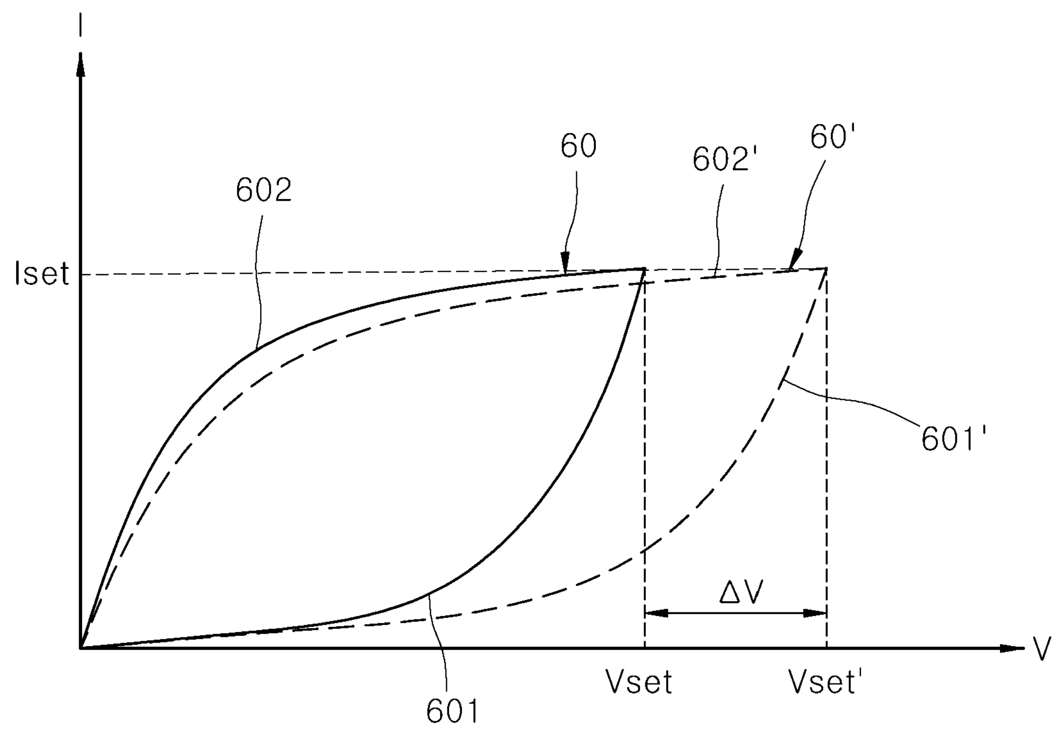
FIG. 6D is a graph schematically illustrating a method of controlling a set voltage of a semiconductor device according to an embodiment of the present disclosure.

FIG. 6A is a graph schematically illustrating I-V characteristics of a semiconductor device according to an embodiment of the present disclosure. FIG. 6B is a graph comparing I-V characteristics of a conventional semiconductor device and a semiconductor device according to an embodiment of the present disclosure. FIG. 6C is a graph schematically illustrating a method of implementing a multilevel signal in a semiconductor device according to an embodiment of the present disclosure. FIG. 6D is a graph schematically illustrating a method of controlling a set voltage of a semiconductor device according to an embodiment of the present disclosure. The I-V characteristics of FIGS. 6A to 6D may be electrical characteristics of a semiconductor device 1 described above with reference to FIGS. 1 to 3.

Referring to FIG. 6A, in an initial high resistance state, a set operation may be performed by applying a voltage having a positive polarity. As the voltage increases, an output current may increase along a first portion 601 of the graph 60. In a first voltage section V1 of the first portion 601, in which the applied voltage is small, the slope of the I-V graph, which represents the current increase relative to the voltage increase, may be relatively small. That is, in the first voltage section V1, the output current may increase relatively gently as the voltage increases. In a second voltage section V2 in which the applied voltage is sufficiently large in the first portion 601, the slope of the I-V graph may increase faster as the applied voltage increases. That is, in the second voltage section V2, as the voltage increases, the output current may increase relatively rapidly compared with the first voltage section V1.

In a semiconductor device of an embodiment, the resistance state may be gradually switched from a high resistance state to a low resistance state until the applied voltage reaches the set voltage Vset in the second voltage period V2. As illustrated in FIG. 6A, a semiconductor device 1 may output a set current Iset in a low resistance state at the set voltage Vset. Thereafter, when the voltage applied to the semiconductor device 1 decreases, the output current may decrease along a second portion 602 of the graph 60. After the voltage applied to the semiconductor device 1 is removed, the semiconductor device 1 may retain a low resistance state along the second portion 602 such that when a voltage having a positive polarity is applied again to the semiconductor device 1, the semiconductor device 1 may output a current increasing along the second portion 602.

Referring to FIG. 6A, in an initial state of low resistance, a reset operation may be performed by applying a voltage having a negative polarity. As an absolute value of the voltage increases, the output current may increase along a third portion 603 of the graph 60. In a third voltage section V3 of the third portion 603 in which the applied voltage is small, the slope of the I-V graph, that is, the current increase relative to the voltage increase may be relatively large. That is, the semiconductor device 1 may exhibit low resistance characteristics. In a fourth voltage section V4 in which the applied voltage is sufficiently large, the slope of the I-V graph may decrease as the applied voltage increases in the third portion 603. That is, in the semiconductor device 1, the resistance state may be gradually switched from a low resistance state to a high resistance state until the applied voltage reaches the reset voltage Vreset in the fourth voltage section V4. That is, the resistance state might not be rapidly switched from a low resistance state to a high resistance state. Accordingly, the output current might not decrease rapidly as the applied voltage increases in the fourth voltage section V4. The semiconductor device 1 may output a reset current Ireset in a high resistance state at the reset voltage Vreset. Thereafter, when the voltage applied to the semiconductor device 1 decreases, the output current may decrease along the fourth portion 604 of the graph 60. After the voltage applied to the semiconductor device 1 is removed, the semiconductor device 1 may store a high resistance state. That is, when a voltage having a positive polarity is applied again to the semiconductor device 1, the semiconductor device 1 may output a current increasing along the first portion 601.

Referring to FIG. 6B, the first graph 60 indicating the electrical characteristics of a semiconductor device according to an embodiment of the present disclosure, and second and third graphs 70*a* and 70*b* indicating the electrical characteristics of a conventional semiconductor device, are illustrated. The first graph 60 may be a portion of the graph 60 of FIG. 6A having a first portion 601 and a second portion 602. The second graph 70*a* and the third graph 70*b* are graphs illustrating I-V characteristics according to the forming operation and the set operation of the conventional semiconductor device, respectively. The conventional semiconductor device may have a structure in which a resistor layer 150 is omitted from the semiconductor device 1 according to embodiments of the present disclosure and as described above with reference to FIG. 4A. That is, a semiconductor device 1 and a conventional device differ in that in a conventional semiconductor device, the channel layer 140 and the resistance changing layer 160 may directly contact each other. Accordingly, in the conventional semiconductor device, in the circuit diagram of FIG. 4B, the first and second fixed resistors R1 and R2 on the first path L1 and the third path L3 (see FIG. 4B), respectively, may be omitted.

Referring to FIG. 6B, when the conventional semiconductor device includes a transition metal oxide as a resistance changing layer, it is necessary to perform a forming operation when the conventional semiconductor device is first driven. The forming operation may be performed by applying a forming voltage Vform-c to the resistance changing layer to separate oxygen from the transition metal oxide in order to generate oxygen vacancies, and by aligning the oxygen vacancies in the application direction of the forming voltage to form a conductive filament. The forming operation may occur when an applied voltage having a positive polarity reaches the forming voltage Vform-c, as illustrated in FIG. 6B. An output current gradually increasing along a first portion 701 of the second graph 70*a* of FIG. 6B may rapidly increase at the forming voltage Vform-c. The rapidly increasing output current is expressed as a compliance current Ic in FIG. 6B. Thereafter, when the applied voltage is decreased to 0 V, the output current may decrease along a second portion 702.

Meanwhile, although not illustrated, in the conventional semiconductor device, after a reset operation of disconnecting a portion of the formed conductive filament, a set operation may be performed again. As in the third graph 70*b*, in an initial high resistance state, the set operation may be performed by applying a voltage having a positive polarity. Because the set operation is an operation of restoring the partially disconnected conductive filament, the set operation may occur at a set voltage Vset-c at which the applied voltage is lower than the forming voltage Vform-c. The output current gradually increasing along a first portion 703 of the third graph 70*b* of FIG. 6B may rapidly increase from the set voltage Vset-c to the compliance current Ic. Thereafter, when the applied voltage is decreased to 0 V, the output current may decrease along a second portion 704.

As described above, in the case of a conventional semiconductor device, the forming operation and the set operation for converting the resistance state from a high resistance state to a low resistance state may occur through a rapid increase in output current at the forming voltage Vform-c and at the set voltage Vset-c, respectively. In contrast, in a semiconductor device according to an embodiment of the present disclosure, the set operation may gradually occur within in a voltage range, as for example, in the second voltage range V2 of FIG. 6A.

In addition, as described above, in an embodiment of the present disclosure, when manufacturing of a semiconductor device is completed, the resistance changing layer may include a sufficient amount of oxygen vacancies for forming a conductive filament. Accordingly, when the semiconductor device is operated, a set operation may be immediately performed without a forming operation for generating oxygen vacancies. In an embodiment of the present disclosure, a method of manufacturing a semiconductor device in which the resistance changing layer contains a sufficient amount of oxygen vacancies will be described later with reference to FIG. 7.

Referring to FIG. 6C, a semiconductor device according to an embodiment of the present disclosure may implement a plurality of different resistance states. Referring to the graph 60*a* of FIG. 6C, in an initial high resistance state, when a voltage having a positive polarity is applied while increasing from 0 V, an output current may increase along the first portion 610. Until the applied voltage reaches a first set voltage Vset1, a resistance state of the semiconductor device may be gradually switched from a high resistance state to a low resistance state.

After increasing the applied voltage to the first set voltage Vset1, when the applied voltage is decreased to 0 V, the output current may decrease from a first set current Iset1 along a second portion 611. Thereafter, when a voltage having a positive polarity is applied again while increasing from 0 V, the output current may increase along the second portion 611. Accordingly, the semiconductor device may have current characteristics along the second portion 611. That is, the semiconductor device may retain the first low resistance state that in a non-volatile manner.

In another example, after increasing the applied voltage to a second set voltage Vset2 from an initial high resistance state, when the applied voltage is decreased to 0 V, the output current may decrease along a third portion 612 from the second set current Iset2. Thereafter, when a voltage having positive polarity is applied again while increasing from 0 V, the output current may increase along the third portion 612. Accordingly, the semiconductor device may have a current characteristic along the third portion 612. That is, the semiconductor device may non-volatilely retain the second low resistance state.

Similarly, after increasing the applied voltage to a third set voltage Vset3 from the initial high resistance state, when the applied voltage is decreased to 0 V, the output current may decrease along a fourth portion 613 from the third set current Iset3. Accordingly, the semiconductor device may have current characteristics along the fourth portion 613 and may retain the third low resistance state in a non-volatile manner. In addition, after increasing the applied voltage to a fourth set voltage Vset4, when the applied voltage is decreased to 0 V, the output current may decrease along a fifth portion 614 from the fourth set current Iset4. Accordingly, the semiconductor device may have current characteristics along the fifth portion 614 and non-volatilely retain the third low resistance state.

Referring to FIG. 6C, as an example, a read operation may be performed by applying a read voltage Va, which is less than the first set voltage Vset1, to the semiconductor device to identify the output currents of the first to fifth portions 610 to 614, respectively. As another example, a read operation may be performed by applying a read current Ia, which is less than the first set current Iset1, to the semiconductor device to identify the output voltages V610 to V614 of the first to fifth portions 610 to 614, respectively.

FIG. 6D illustrates a method of controlling a set voltage according to an embodiment of the present disclosure. Referring to FIG. 6D, in a first graph 60 and a second graph 60', each of the applied voltages may have current characteristics along the first portions 601 and 601' until reaching the set voltages Vset and Vset' from the initial high resistance states, respectively, and may exhibit current characteristics of the low resistance states along the second portions 602 and 602' after reaching the set voltages Vset and Vset', respectively. The set voltage Vset' of the second graph 60' may be greater than the set voltage Vset of the first graph 60 by ΔV.

According to an embodiment of the present disclosure, in the semiconductor device of FIG. 4A, the magnitude of the set voltage may be controlled by controlling the length L160 of the resistance changing layer 160. As an example, regardless of the resistance state of the resistance changing layer 160, as the length L160 of the resistance changing layer 160 increases, the resistance of the resistance changing layer 160 along the z-direction may increase. Accordingly, as the length L160 of the resistance changing layer 160 increases, the magnitude of the set voltage at which the resistance of the resistance changing layer 160 is converted from a high resistance state to a low resistance state may increase. Accordingly, in the second graph 60', compared to the first graph 60, the set voltage may be shifted in the positive voltage direction.

Meanwhile, if the magnitude of the set voltage increases, when a read operation is performed for the resistance changing layer in which multi-level signal information is stored, the ability to discriminate between multi-level signal information may be enhanced. Referring to FIG. 6C again, in an embodiment, the read operation for the multi-level signal information may be performed as a process of applying a read current Ia and discriminating among the output voltages V610, V611, V612, V613, and V614 of the first to fifth portions 610, 611, 612, 613, and 614, respectively. Referring to FIGS. 6C and 6D together, as the second graph 60' of FIG. 6D is shifted in the positive voltage direction as compared to the first graph 60, the semiconductor device corresponding to the second graph 60' may secure a relatively large voltage gap between the plurality of output voltages during the read operation using a read current. That is, a relatively large voltage margin or window for discriminating the plurality of output voltages from each other may be secured. Accordingly, the semiconductor device corresponding to the second graph 60' may be more accurate with superior discrimination between voltages when reading multi-level signal information when compared to a semiconductor device corresponding to the first graph 60.

Figure 7A:
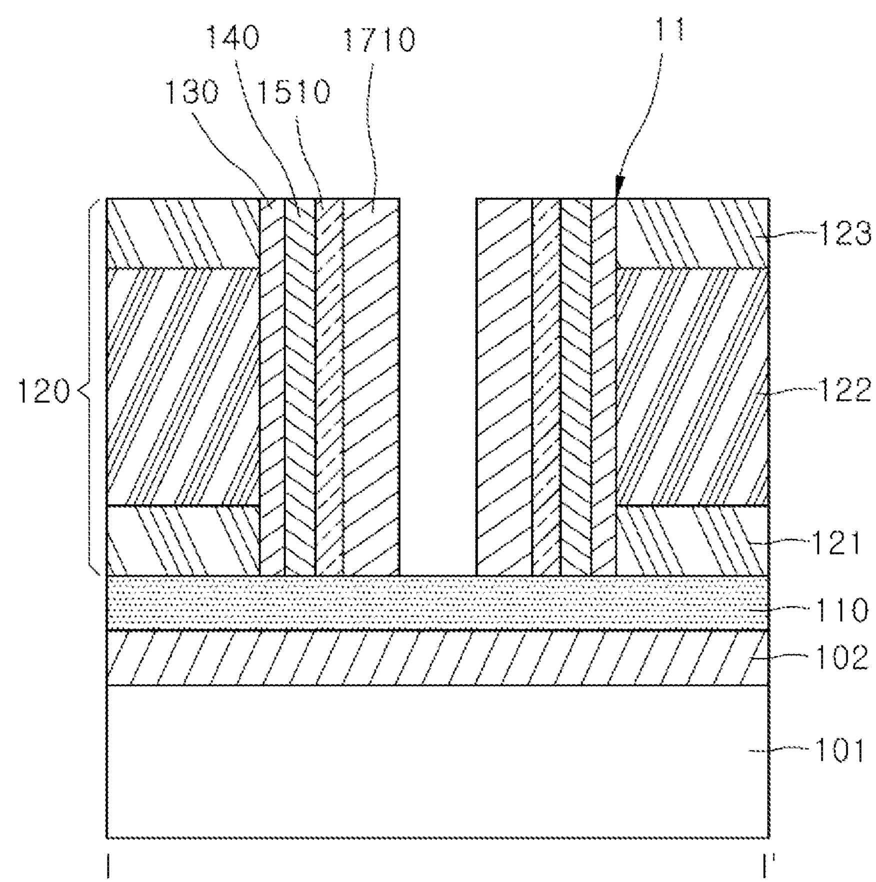
FIGS. 7A and 7B are cross-sectional views illustrating a method of manufacturing a semiconductor device according to an embodiment of the present disclosure.
Figure 7B:
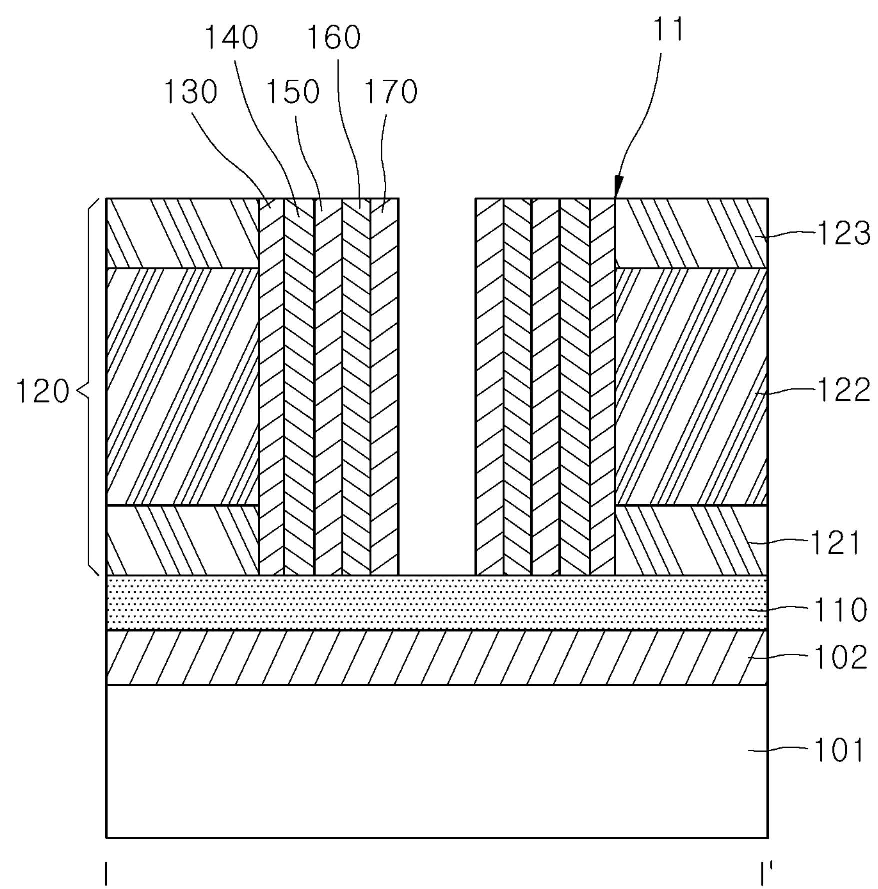

FIGS. 7A and 7B are cross-sectional views illustrating a method of manufacturing a semiconductor device according to an embodiment of the present disclosure. In an embodiment, the method described with reference to FIGS. 7A and 7B may be applied to a method of manufacturing a semiconductor device 1 of FIGS. 1 to 3.

Referring to FIG. 7A, a base insulating layer 102 and a channel lower contact layer 110 may be sequentially formed on a substrate 101. A gate structure 120 including a hole pattern 11 may be formed on the channel lower contact layer 110.

Subsequently, a gate insulating layer 130, a channel layer 140, an oxidation reaction layer 1510, and a reduction reaction layer 1710 may be sequentially formed on a sidewall surface of the gate structure 120 located inside the hole pattern 11.

The oxidation reaction layer 1510 may include, for example, silicon (Si) or aluminum (Al). The reduction reaction layer 1710 may include metal oxide. The metal oxide may include, for example, lithium oxide, titanium oxide, nickel oxide, copper oxide, manganese oxide, hafnium oxide, zirconium oxide, tungsten oxide, niobium oxide, vanadium oxide, or a combination of two or more thereof. In this case, the oxygen affinity of silicon (Si) or aluminum (Al) of the oxidation reaction layer 1510 may be greater than that of the metal in the metal oxide constituting the reduction reaction layer 1710. In this specification, the meaning of oxygen affinity may refer to a bonding force between an element and oxygen in an oxide when the element is combined with oxygen to form an oxide. As an example, when the oxidation reaction layer 1510 contains silicon and the silicon is combined with oxygen to form silicon oxide, the oxygen affinity of the silicon may refer to the bonding force between the silicon and oxygen in the silicon oxide. An element having a high oxygen affinity may have a relatively higher probability of forming an oxide by combining with oxygen than an element having a low oxygen affinity. In addition, an oxide containing an element having a relatively high oxygen affinity may have a relatively low probability that oxygen is ionized by breaking a bond with the element in the oxide, compared to an oxide containing an element with a relatively low oxygen affinity.

In an embodiment of the present disclosure, when the reduction reaction layer 1710 is formed on the oxidation reaction layer 1510, silicon or aluminum in the oxidation reaction layer 1510 may be combined with oxygen, of the metal oxide of the reduction reaction layer 1710, to form silicon oxide or aluminum oxide. As a result, the metal oxide of the reduction reaction layer 1710 may be reduced. In another embodiment, after the reduction reaction layer 1710 is formed on the oxidation reaction layer 1510, by additionally performing heat treatment, the redox reaction between the oxidation reaction layer 1510 and the reduction reaction layer 1710 may be facilitated. Accordingly, as illustrated in FIG. 7B, the entire oxidation reaction layer (1510 of FIG. 7A) may be oxidized to form a resistor layer 150. In an embodiment, by forming the oxidation reaction layer 1510 in a thickness of 1 nm to 5 nm, the entire oxidation reaction layer 1510 may be effectively oxidized. A portion of the reduction reaction layer 1710 reduced by a reaction with the oxidation reaction layer 1510 may include metal oxide deficient in oxygen (i.e., metal oxide having oxygen vacancies). The reduced portion may form a resistance changing layer 160. A portion of the reduction reaction layer 1710 that does not participate in the reaction with the oxidation reaction layer 1510 may form an insulating layer 170. Subsequently, the hole pattern 11 may be filled with an insulating material to form a filling layer (not illustrated). A channel upper contact layer (not illustrated) and a bit line (not illustrated) may be formed outside the hole pattern 11. As a result, the semiconductor device 1 described with reference to FIGS. 1 to 3 may be manufactured.

In some embodiments, after the redox reaction between the oxidation reaction layer 1510 and the reduction reaction layer 1710 is completed, the insulating layer 170 may be removed to expose the resistance changing layer 160. Subsequently, the hole pattern 11 may be filled with an insulating material to form a filling layer (not illustrated). A channel upper contact layer (not illustrated) and a bit line (not illustrated) may be formed outside the hole pattern 11. Accordingly, unlike the device illustrated in FIG. 7B, as a modified example of a semiconductor device 1 of FIGS. 1 to 3, the insulating layer 170 does not exist and the resistance changing layer 160 is in direct contact with the filling layer 180.

In some embodiments, in the process of forming the resistance changing layer 160, the resistance changing layer 160 may further include silicon or aluminum that diffuses from the oxidation reaction layer 1510 into the resistance changing layer 160. The diffused silicon or aluminum may additionally restore the metal oxide in the resistance changing layer 160. By the reduction of the metal oxide, the concentration of oxygen vacancy in the resistance changing layer 160 may be additionally increased.

As described above, the resistance changing layer 160, including oxygen vacancies, may be generated by the reaction between the oxidation reaction layer 1510 and the reduction reaction layer 1710. In addition, when the resistance changing layer 160 is generated, the resistance changing layer 160 may retain a sufficient amount of oxygen vacancies for the set and reset operations of the semiconductor device. Accordingly, a forming operation is not necessary to operate a semiconductor device according to an embodiment of the present disclosure.

Figure 8A:
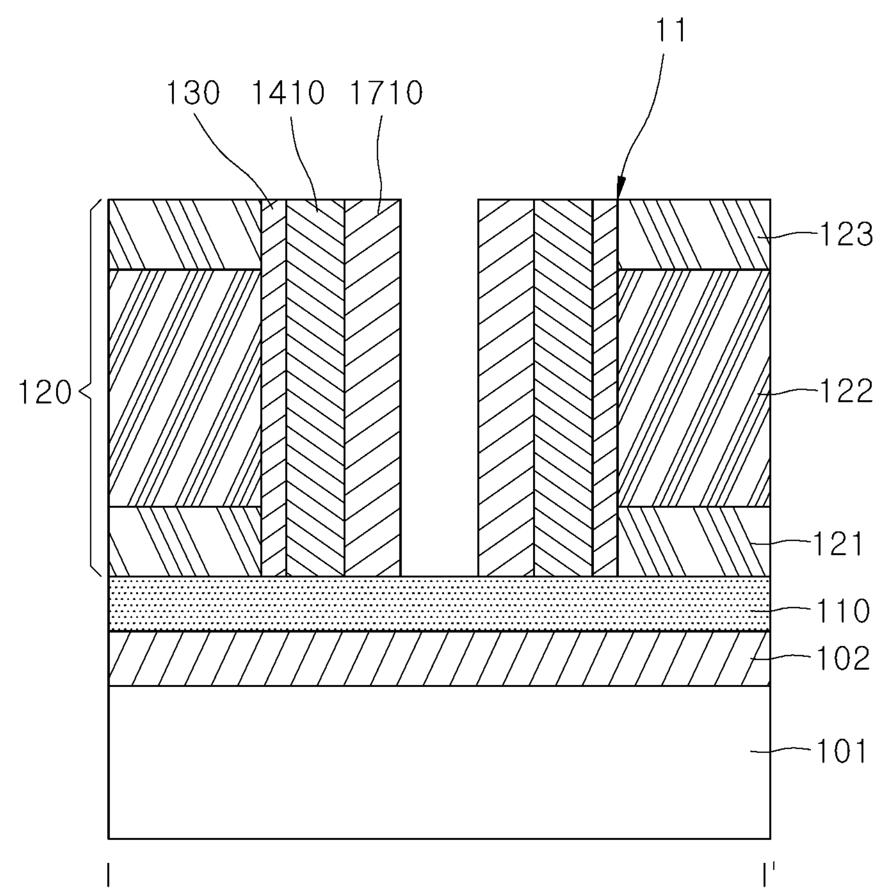
FIGS. 8A and 8B are cross-sectional views illustrating a method of manufacturing a semiconductor device according to another embodiment of the present disclosure.
Figure 8B:
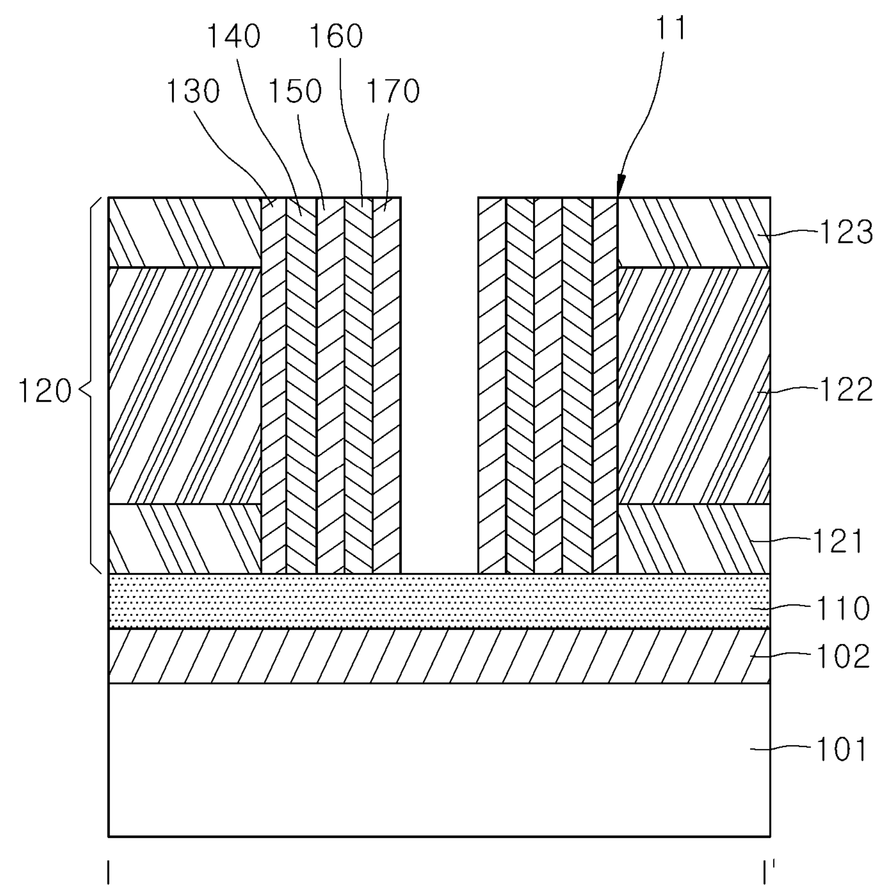

FIGS. 8A and 8B are cross-sectional views illustrating a method of manufacturing a semiconductor device according to another embodiment of the present disclosure. In an embodiment, the method described with reference to FIGS. 8A and 8B may be applied to a method of manufacturing a semiconductor device 1 of FIGS. 1 to 3.

Referring to FIG. 8A, a base insulating layer 102 and a channel lower contact layer 110 may be sequentially formed on a substrate 101. A gate structure 120 including a hole pattern 11 may be formed on the channel lower contact layer 110.

Subsequently, a gate insulating layer 130, a channel formation layer 1410, and a reduction reaction layer 1710 may be sequentially formed on a sidewall surface of the gate structure 120, located inside the hole pattern 11.

The channel formation layer 1410 may include a semiconductor material. The semiconductor material may include, for example, silicon (Si), germanium (Ge), gallium arsenide (GaAs), or the like. The reduction reaction layer 1710 may include metal oxide. The metal oxide may include, for example, lithium oxide, titanium oxide, nickel oxide, copper oxide, manganese oxide, hafnium oxide, zirconium oxide, tungsten oxide, niobium oxide, vanadium oxide, or a combination of two or more thereof. The oxygen affinity of the semiconductor material of the channel formation layer 1410 may be greater than that of the metal in the metal oxide constituting the reduction reaction layer 1710.

In an embodiment of the present disclosure, when a reduction reaction layer 1710 is formed on a channel formation layer 1410 that includes silicon (Si), a portion of the channel formation layer 1410 and a portion of the reduction reaction layer 1710 may react with each other. That is, a portion of the channel formation layer 1410 may be oxidized to silicon oxide, and a portion of the reduction reaction layer 1710 may be reduced. In another embodiment, after the reduction reaction layer 1710 is formed on the channel formation layer 1410, heat treatment may be further performed to promote the redox reaction between the channel formation layer 1410 and the reduction reaction layer 1710.

As a result, as illustrated in FIG. 8B, the oxidized portion of the channel formation layer 1410 may form a resistor layer 150. A portion of the channel formation layer 1410 that is not oxidized may form the channel layer 140. A portion of the reduction reaction layer 1710 reduced by the reaction with the channel formation layer 1410 may include a metal oxide depleted of oxygen (i.e., metal oxide having oxygen vacancies). The reduced portion may form the resistance changing layer 160. A portion of the reduction reaction layer 1710 that does not participate in the redox reaction with the channel forming layer 1410 may remain to form an insulating layer 170. Subsequently, the hole pattern 11 may be filled with an insulating material to form a filling layer (not illustrated). As a result, the semiconductor device 1 described with reference to FIGS. 1 to 3 may be manufactured.

In some embodiments, after the redox reaction between the channel formation layer 1410 and the reduction reaction layer 1710 is completed, the insulating layer 170 may be removed to expose the resistance changing layer 160. Subsequently, the hole pattern 11 may be filled with an insulating material to form a filling layer (not illustrated). Accordingly, unlike the device illustrated in FIG. 8B, as a modified example of the semiconductor device 1 of FIGS. 1 to 3, a structure in which the insulating layer 170 does not exist, and the resistance changing layer 160 and the filling layer 180 are in direct contact, may be provided.

Figure 9:
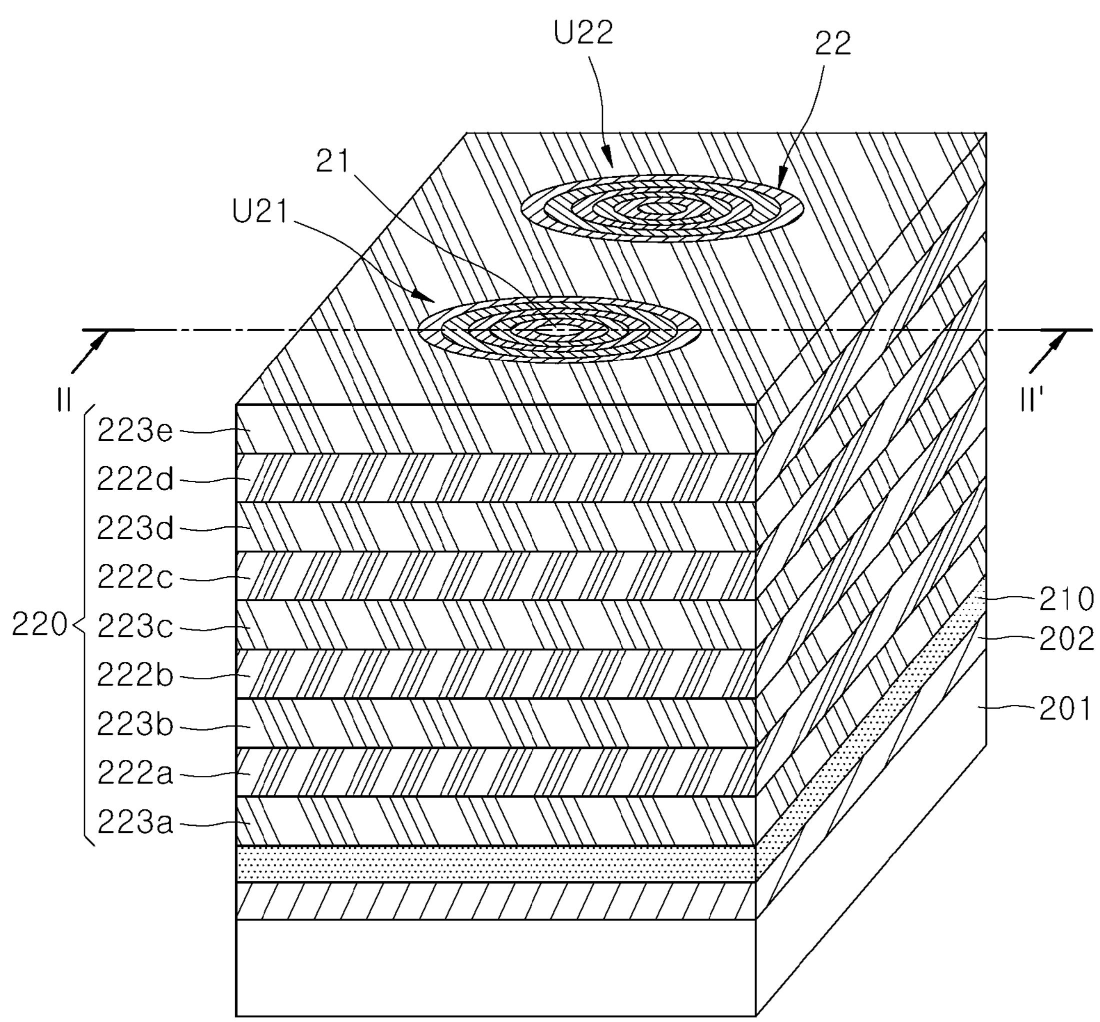
FIG. 9 is a perspective view schematically illustrating a semiconductor device according to another embodiment of the present disclosure.
Figure 10:
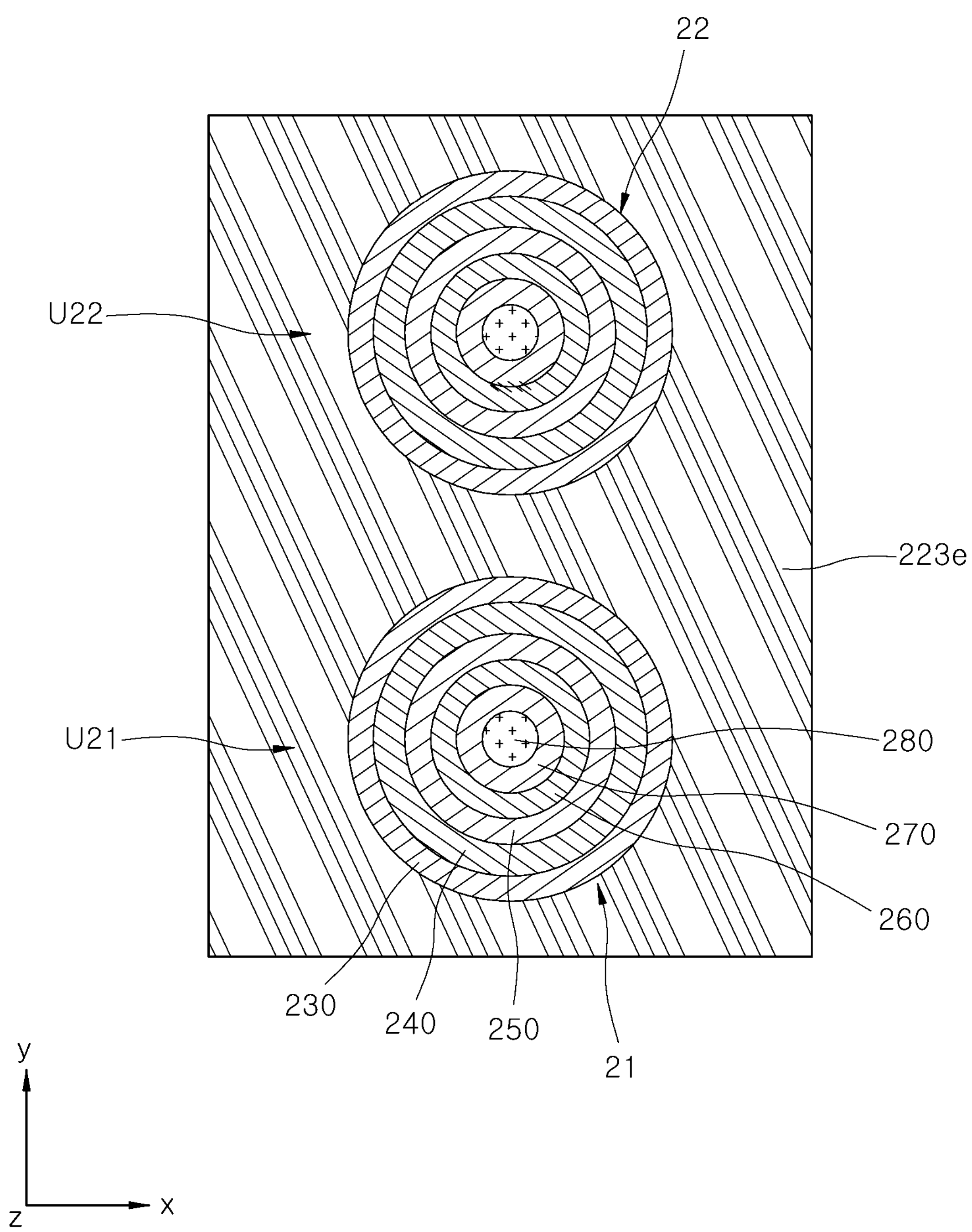
FIG. 10 is a plan view of the semiconductor device of FIG. 9.
Figure 11:
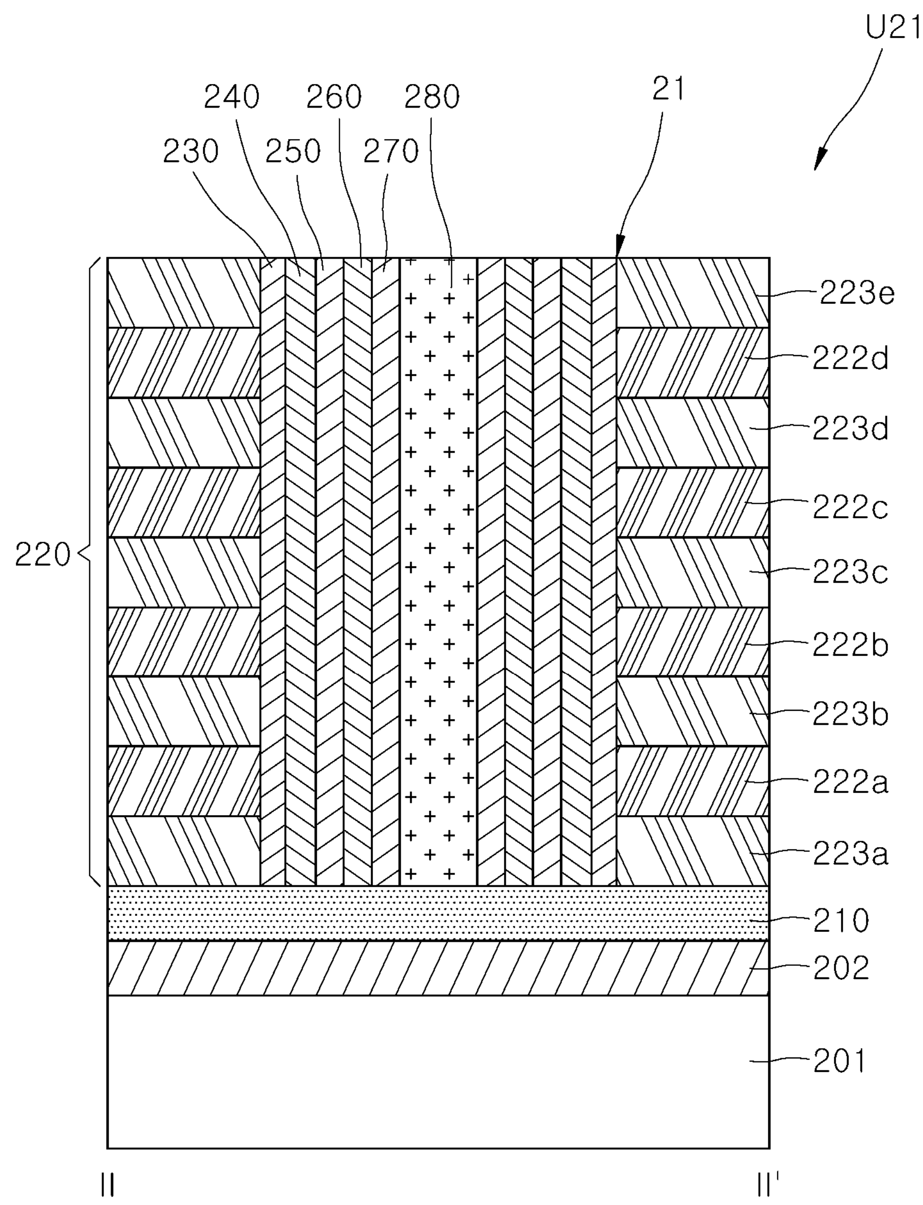
FIG. 11 is a cross-sectional view taken along line II-II' of the semiconductor device of FIG. 9.

FIG. 9 is a perspective view schematically illustrating a semiconductor device according to another embodiment of the present disclosure. FIG. 10 is a plan view of the semiconductor device of FIG. 9. FIG. 11 is a cross-sectional view taken along a line II-II' of the semiconductor device of FIG. 9.

Referring to FIGS. 9 to 11, a semiconductor device 2 may include a substrate 201 and a gate structure 220 disposed over a substrate 201. The semiconductor device 2 may include first and second hole patterns 21 and 22 penetrating the gate structure 220 over the substrate 201. The semiconductor device 2 may include a gate insulating layer 230, a channel layer 240, and a resistor layer 250, and a resistance changing layer 260 in each of the first and second hole patterns 21 and 22. The semiconductor device 2 may include an insulating layer 270 disposed to contact the resistance changing layer 260 in each of the first and second hole patterns 21 and 22. In addition, the semiconductor device 2 may further include filling layers 280 disposed to contact the insulating layers 270 and to fill the first and second hole patterns 21 and 22.

Referring to FIGS. 9 to 11, the substrate 201 may be provided. The substrate 201 may be substantially the same as the substrate 101 described in detail with reference to FIGS. 1 to 3.

A base insulating layer 202 may be disposed on the substrate 201. The base insulating layer 202 may be substantially the same as the base insulating layer 102 described in detail with reference to FIGS. 1 to 3.

A channel lower contact layer 210 may be disposed on the base insulating layer 202. The channel lower contact layer 210 may be electrically connected to an end of the channel layer 240. Although not illustrated, the channel lower contact layer 210 may be connected to a source line (not illustrated). The channel lower contact layer 210 may provide a potential of the source line to the channel layer 240. The channel lower contact layer 210 may be substantially the same as the channel lower contact layer 110 described in detail with reference to FIGS. 1 to 3.

The gate structure 220 may be disposed on the channel lower contact layer 210. The gate structure 220 may include first to fourth gate electrode layers 222*a*, 222*b*, 222*c*, and 222*d* and first to fifth interlayer insulating layers 223*a*, 223*b*, 223*c*, 223*d*, and 223*e*, which are alternately stacked along a first direction (i.e., z-direction) perpendicular to the substrate 201. The first interlayer insulating layer 223*a* may be disposed to contact the channel lower contact layer 210. The fifth interlayer insulating layer 223*e* may be disposed as an uppermost layer of the gate structure 220. The number of the gate electrode layers of the gate structure 220 is not necessarily be limited to four. In some embodiments, the gate electrode layers may be disposed in different numbers, and the interlayer insulating layers may be arranged in various numbers to insulate the various numbers of gate electrode layers from each other along the first direction (i.e., z-direction).

The first to fourth gate electrode layers 222*a*, 222*b*, 222*c*, and 222*d* may include a conductive material. The conductive material may include, for example, doped semiconductor, metal, conductive metal nitride, conductive metal carbide, conductive metal silicide, or conductive metal oxide. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Each of the first to fifth interlayer insulating layers 223*a*, 223*b*, 223*c*, 223*d*, and 223*e* may include an insulating material. The insulating material may include, for example, oxide, nitride, oxynitride, or a combination of two or more thereof.

Referring to FIGS. 9 to 11, the first and second hole patterns 21 and 22 penetrating the gate structure 220 may be formed on the channel lower contact layer 210. In an embodiment, as illustrated in FIG. 10, the first and second hole patterns 21 and 22 may be disposed to be spaced apart from each other in a second direction (i.e., y-direction). The first and second hole patterns 21 and 22, as an example, may be formed by lithography and etching processes. As described later, the semiconductor device 2 may include first and second memory units U21 and U22 that are separated from each other for each of the first and second hole patterns 21 and 22. FIGS. 9 and 10 illustrate two hole patterns, but the present disclosure is not limited thereto. The semiconductor device 2 may include a variety of different number of hole patterns disposed spaced apart from each other in the x-direction or the y-direction.

Referring to FIGS. 9 to 11, the gate insulating layer 230 may be disposed on a sidewall surface of the gate structure 220 inside the first and second hole patterns 21 and 22. The gate insulating layer 230 may be disposed to cover the sidewall surface of the gate structure 220. The gate insulating layer 230 may include, for example, oxide, nitride, oxynitride, or a combination of two or more thereof.

The channel layer 240 may be disposed on a sidewall surface of the gate insulating layer 230. An end of the channel layer 240 may be disposed to contact the channel lower contact layer 210. The channel layer 240 may include a semiconductor material. The channel layer 240 may be formed of substantially the same material as the channel layer 140 described above with reference to FIGS. 1 to 3.

The resistor layer 250, the resistance changing layer 260, and the insulating layer 270 may be sequentially disposed on a sidewall surface of the channel layer 240. The resistor layer 250 may be disposed to cover the channel layer 240. The resistance changing layer 260 may be disposed to cover the resistor layer 250. The insulating layer 270 may be disposed to cover the resistance changing layer 260. Each of the resistor layer 250, the resistance changing layer 260, and the insulating layer 270 may be disposed on a side of the channel layer 240 opposite to another side of the channel layer 240 in contact with the gate insulating layer 230.

The resistor layer 250 may have invariable or fixed resistivity. While the resistance of the resistance changing layer 260 may be changed by the application of an external electric field, the resistance of the resistor layer 250 might not be changed by the external electric field. The resistor layer 250 may include oxide having a predetermined electrical resistance. The resistor layer 250 might not contain oxygen vacancies or may have a sufficiently low oxygen vacancy concentration compared to the resistance changing layer 260. The sufficiently low oxygen vacancy concentration may mean a concentration such that a change in distribution of oxygen vacancies in the resistor layer 250 cannot result in a change to the electrical resistance state of the resistor layer 250. The resistor layer 250, as an example, may have a thickness of 1 nm to 5 nm. The resistor layer 250 may be made of substantially the same material as the resistor layer 150 described in detail with reference to FIGS. 1 to 3.

The resistance changing layer 260 may be disposed to cover a sidewall of the resistor layer 250. The resistance changing layer 260 may include oxygen vacancies that can move along an electric field when the electric field having a magnitude greater than or equal to a threshold value is applied to the resistance changing layer 260. The electric field may change the distribution of oxygen vacancies in the resistance changing layer 260. In addition, the resistance changing layer 260 may have different electrical resistances according to the distribution of the oxygen vacancies. As an example, when the oxygen vacancies are uniformly distributed in the resistance changing layer 260, the resistance changing layer 260 may maintain a high resistance state. As another example, when the oxygen vacancies are densely distributed in one direction through an applied electric field, the resistance changing layer 260 may have a lower resistance compared to the high resistance state.

The resistance changing layer 260 may retain the resistance state changed by the application of the electric field even after the electric field is removed. Accordingly, the resistance changing layer 260 may function as a memory layer that stores the resistance state as signal information in a non-volatile manner. The resistance changing layer 260 may be made of substantially the same material as the resistance changing layer 160 described in detail with reference to FIGS. 1 to 3.

In an embodiment, the resistance changing layer 260 may include oxide of the same metal as the insulating layer 270. However, the metal oxide of the resistance changing layer 260 may have a smaller amount of oxygen than the metal oxide of the insulating layer 270. Accordingly, the resistance changing layer 260 may have oxygen vacancies in a higher concentration than the insulating layer 270.

In some embodiments, the resistance changing layer 260 may further include impurities that can bond to oxygen. As an example, the impurities may include silicon (Si) or aluminum (Al). The impurity may have a greater affinity for oxygen than metal constituting the metal oxide of the resistance changing layer 260. Accordingly, the impurity may reduce the metal oxide of the resistance changing layer 260. By reduction of the metal oxide, oxygen vacancies may be generated in the metal oxide. As a result, the impurities are distributed in the resistance changing layer 260 so that oxygen deficiency in the metal oxide may be additionally increased. Accordingly, the concentration of oxygen vacancy in the resistance changing layer 260 may be additionally increased. In an embodiment, the impurities may be implanted into the resistance changing layer 160 by a doping method or an ion implantation method. When implanting the impurities, the content of the impurities may be controlled.

The insulating layer 270 may be disposed to cover a sidewall surface of the resistance changing layer 260. The insulating layer 270 may have electrical insulative properties. In an embodiment, the insulating layer 270 may include oxide of the same metal as the resistance changing layer 260. However, the metal oxide of the insulating layer 270 may have a larger amount of oxygen than the metal oxide of the resistance changing layer 260. In an embodiment, compared to the resistance changing layer 260, the insulating layer 270 may have a low concentration of oxygen vacancies so that the internal electrical resistance state of the insulating layer 270 cannot be changed. In an embodiment, the metal oxide of the insulating layer 270 may satisfy a stoichiometric ratio between the metal and oxygen that constitute the metal oxide.

Referring to FIGS. 9 to 11 again, the filling layer 280 may be disposed inside each of the first and second hole patterns 21 and 22 in which the gate insulating layer 230, the channel layer 240, the resistor layer 250, the resistance changing layer 260, and the insulating layer 270 are formed. The filling layer 280 may include, for example, oxide, nitride, oxynitride, or a combination of two or more thereof. The filling layer 280 may contact the insulating layer 270 inside each of the first and second hole patterns 21 and 22. Although not illustrated in FIGS. 9 to 11, a channel upper contact layer in contact with an end of the channel layer 240 may be disposed outside the first and second hole patterns 21 and 22. The channel upper contact layer may electrically connect the channel layer 240 to a bit line (not illustrated). Although not illustrated in FIGS. 9 to 11, the bit line may be disposed on the gate structure 220 in the form of a conductive line pattern, and may be electrically connected to the channel upper contact layer. The bit line may provide a potential of the bit line to the channel layer 240 through the channel upper contact layer.

In some embodiments, the insulating layer 270 may be omitted in the semiconductor device 2 of FIGS. 9 to 11. In such instances, the filling layer 280 may be disposed to contact the resistance changing layer 260.

Figure 12:
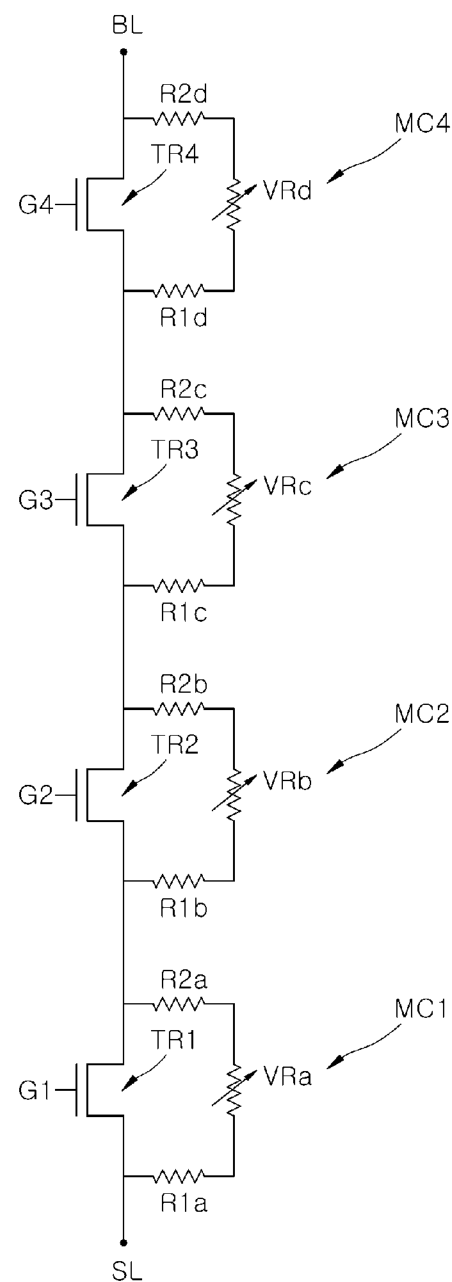
FIG. 12 is a circuit diagram of a semiconductor device according to an embodiment of the present disclosure.

FIG. 12 is a circuit diagram of a semiconductor device according to an embodiment of the present disclosure. As an example, FIG. 12 may be a circuit diagram of one of the first and second memory units U21 and U22 of the semiconductor device 2 of FIGS. 9 to 11. Hereinafter, as an example, the operation of the semiconductor device will be described using the circuit diagram of the first memory unit U21. Specifically, the circuit diagram of FIG. 12 may include a gate insulating layer 230, a channel layer 240, a resistor layer 250, a resistance changing layer 260, and first to fourth gate electrode layers 222*a*, 222*b*, 222*c*, and 222*d* inside the first hole pattern 21 of FIG. 11.

Referring to FIG. 12, the first memory unit U21 may include first to fourth memory cells MC1, MC2, MC3, and MC4. The first to fourth memory cells MC1, MC2, MC3, and MC4 may be connected in series between a source line SL and a bit line BL. The first to fourth memory cells MC1, MC2, MC3, and MC4 may include corresponding transistors TR1, TR2, TR3, and TR4, first fixed resistors R1*a*, R1*b*, R1*c*, and R1*d*, second fixed resistors R2*a*, R2*b*, R2*c*, and R2*d*, and variable resistors VRa, VRb, VRc, and VRd, which are connected in parallel to the transistors TR1, TR2, TR3, and TR4, respectively.

The first to fourth gate electrode layers 222*a*, 222*b*, 222*c*, and 222*d* of FIGS. 9 to 11 may correspond respectively to the first to fourth gate electrodes G1, G2, G3, and G4 of FIG. 11. The resistor layer 250 of FIGS. 9 to 11 may configure the first fixed resistors R1*a*, R1*b*, R1*c*, and R1*d* and the second fixed resistors R2*a*, R2*b*, R2*c*, and R2*d* in the first to fourth memory cells MC1, MC2, MC3, and MC4 of FIG. 12, respectively. The resistance changing layer 260 may configure the variable resistors VRa, VRb, VRc, and VRd of the first to fourth memory cells MC1, MC2, MC3, and MC4, respectively.

Hereinafter, an operation method of the third memory cell MC3 will be described, with reference to FIG. 12, as an example. The operation methods of the first memory cell MC1, the second memory cell MC2, and the fourth memory cell MC4 may be substantially the same as that of the third memory cell MC3.

First, a set operation for the third memory cell MC3 will be described. By controlling voltages applied to the first to fourth gate electrodes G1, G2, G3, and G4, the third transistor TR3 may be turned off, and the first transistor TR1, the second transistor TR2, and the fourth transistor TR4 may be turned on. Then, a set voltage may be applied between the bit line BL and the source line SL. As an example, the process of applying the set voltage may be performed by applying a bias having a positive polarity to the bit line BL and grounding the source line SL. The current according to the set voltage may flow through the channel of the turned-on fourth transistor TR4 from the bit line BL, and then may flow through the second fixed resistor R2*c*, the variable resistor VRc, and the first fixed resistor R1*c*, connected in parallel to the third transistor TR3, without passing through a channel of the turned-off third transistor TR3. Subsequently, the current may flow through a channel of the turned-on second transistor TR2 and a channel of the turned-on first transistor TR1 to the source line SL. At this time, as a set electric field is applied between both ends of the variable resistor VRc of the third memory cell MC3 through which the current passes, a resistance state of the variable resistor VRc may be changed from a high resistance state to a low resistance state. Even after the set voltage is removed, the variable resistor VRc of the third memory cell MC3 may maintain a low resistance state, so that the third memory cell MC3 may non-volatilely store signal information corresponding to the low resistance state.

Next, a reset operation for the third memory cell MC3 will be described. By controlling voltages applied to the first to fourth gate electrodes G1, G2, G3, and G4, the third transistor TR3 may be turned off, and the first transistor TR1, the second transistor TR2, and the fourth transistor TR4 may be turned on. Then, a reset voltage may be applied between the bit line BL and the source line SL. The reset voltage may have a voltage polarity opposite to that of the set voltage. As an example, the process of applying the reset voltage may be performed by applying a bias having a negative polarity to the bit line BL and grounding the source line SL.

The current according to the reset voltage may flow through the channel of the turned-on first transistor TR1 and the channel of the turned-on second transistor TR2 from the source line SL. Subsequently, the current may flow through the second fixed resistor R2*c*, the variable resistor VRc, and the first fixed resistor R1*c*, connected in parallel to the third transistor TR3, without passing through the channel of the turned-off third transistor TR3. Subsequently, the current may pass through the channel of the turned-on fourth transistor TR4 to the bit line BL. At this time, as the reset electric field is applied between both ends of the variable resistor VRc of the third memory cell MC3 through which the current passes, the resistance state of the variable resistor VRc may be changed from a low resistance state to a high resistance state. Even after the reset voltage is removed, the variable resistor VRc of the third memory cell MC3 may maintain a high resistance state, so that the third memory cell MC3 may store signal information corresponding to the high resistance state in a non-volatile manner.

Next, a read operation for the third memory cell MC3 will be described. By controlling voltages applied to the first to fourth gate electrodes G1, G2, G3, and G4, the third transistor TR3 may be turned off, and the first transistor TR1, the second transistor TR2, and the fourth transistor TR4 may be turned on. Then, a read voltage may be applied between the bit line BL and the source line SL. As an example, the process of applying the read voltage may be performed by applying a bias having a positive polarity to the bit line BL and grounding the source line SL. The current according to the read voltage may flow through the channel of the turned-on fourth transistor TR4 from the bit line BL, and then may flow through the second fixed resistor R2*c*, the variable resistor VRc, and the first fixed resistor R1*c*, connected in parallel to the third transistor TR3, without passing through the channel of the turned-off third transistor TR3. Subsequently, the current may flow through the channel of the turned-on second transistor TR2 and the channel of the turned-on first transistor TR1 to the source line SL.

The read voltage may have an absolute value smaller than the value of the set voltage and the reset voltage. That is, the read voltage might not change the resistance state of the variable resistor VRc of the third memory cell MC3. By the application of the read voltage, the current passing through the variable resistor VRc of the third memory cell MC3 may have different current values according to the resistance state of the variable resistor VRc. Accordingly, it is possible to check the resistance state of the variable resistor VR3 in the third memory cell MC3 by reading the current value, and the signal information stored in the third memory cell MC3 may be read.

Figure 13:
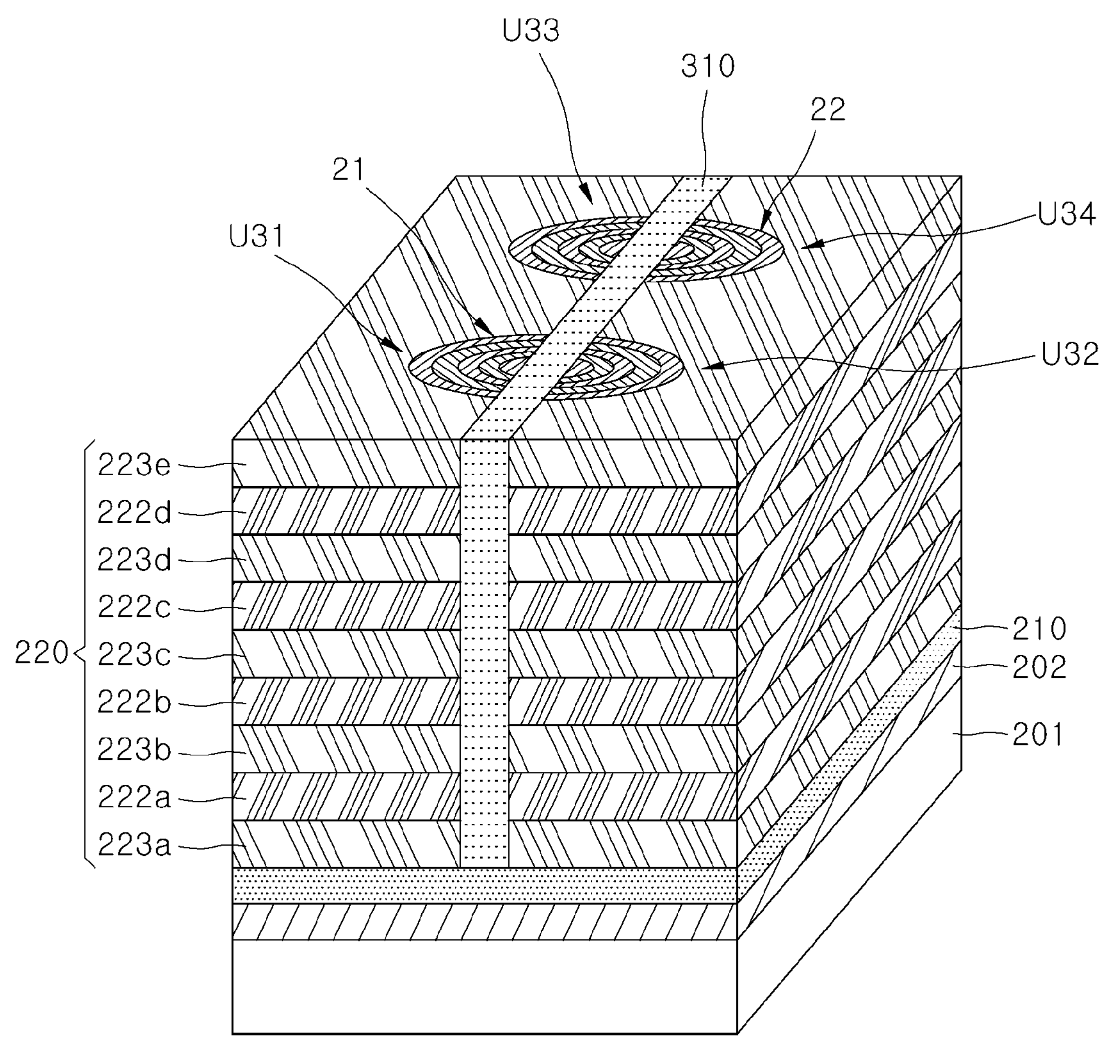
FIG. 13 is a perspective view schematically illustrating a semiconductor device according to another embodiment of the present disclosure.
Figure 14:
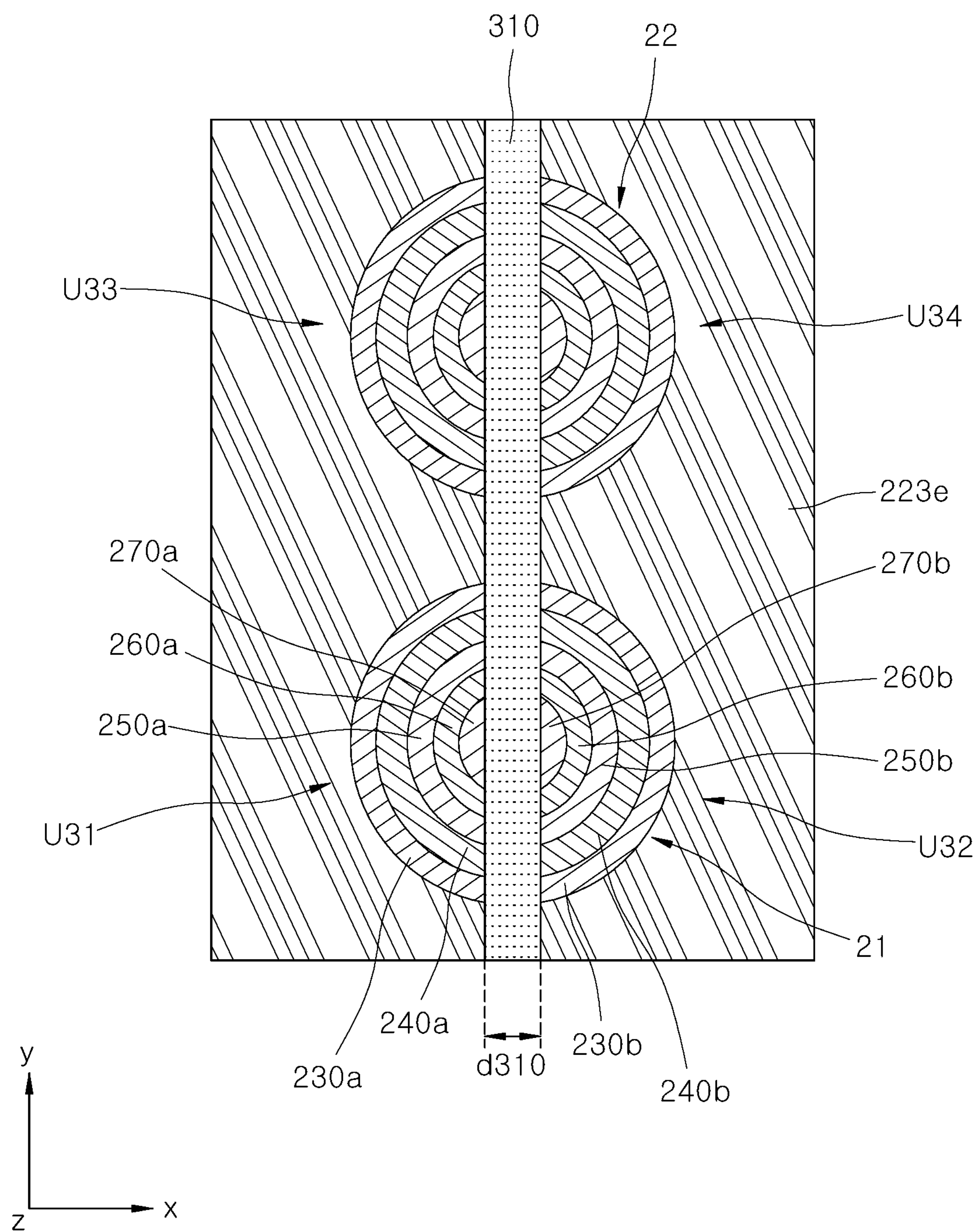
FIG. 14 is a plan view of the semiconductor device of FIG. 13.

FIG. 13 is a perspective view schematically illustrating a semiconductor device according to another embodiment of the present disclosure. FIG. 14 is a plan view of the semiconductor device of FIG. 13.

Referring to FIGS. 13 and 14, a semiconductor device 3 may further include a cell insulating structure 310 when compared to a semiconductor device 2 described above with reference to FIGS. 9 to 11. The semiconductor device 3 may include first to fourth memory units U31, U32, U33, and U34, which are separated from each other by the cell insulating structure 310.

The cell insulating structure 310 may be disposed over the substrate 201 to be connected to the filling layer 280 of the semiconductor device 2 of FIGS. 9 to 11, and may extend in a direction (i.e., y-direction) and may bisect the first and second hole patterns 21 and 22. The cell insulating structure 310 may divide the gate structure 220, the gate insulating layer 230, the channel layer 240, the resistor layer 250, the resistance changing layer 260, and the insulating layer 270 of the semiconductor device of FIGS. 9 to 11 along a direction across the diameters of the first and second hole patterns 21 and 22.

That is, the cell insulating structure 310 may divide the first memory unit U21 of the semiconductor device 2 of FIGS. 9 to 11 into two portions to form a pair of first and second memory units U31 and U32 in the semiconductor device 3 of FIGS. 13 and 14. Further, the cell insulating structure 310 may divide the second memory unit U22 of the semiconductor device 2 of FIGS. 9 to 11 into two portions to form a pair of third and fourth memory units U33 and U34 in the semiconductor device 3 of FIGS. 13 and 14.

The gate insulating layer 230*a*, the channel layer 240*a*, the resistor layer 250*a*, the resistance changing layer 260*a*, and the insulating layer 270*a* of the first memory unit U31 may be symmetrical to the gate insulating layer 230*b*, the channel layer 240*b*, the resistor layer 250*b*, the resistance changing layer 260*b*, and the insulating layer 270*b* of the second memory unit U32, across the cell insulating structure 310. In the same way, the components of the third memory unit U33 and the components of the fourth memory unit U34 may also be symmetrical with each other, based on the cell insulating structure 310.

As described above, by using the cell insulating structure 310, the semiconductor device 3 may increase the density of the memory cells by two as compared to the semiconductor device 2 described above with reference to FIGS. 9 to 11.

Figure 15A:
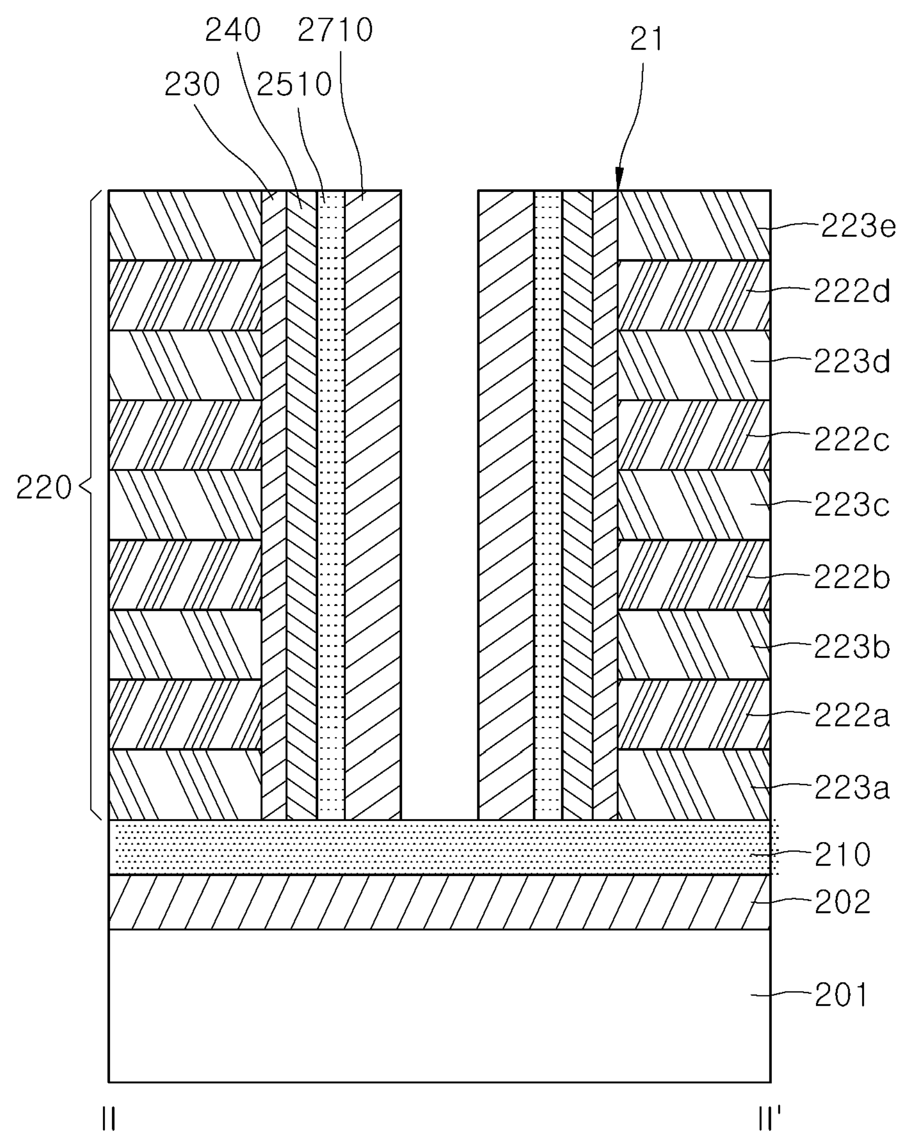
FIGS. 15A and 15B are cross-sectional views schematically illustrating a method of manufacturing a semiconductor device according to an embodiment of the present disclosure.
Figure 15B:
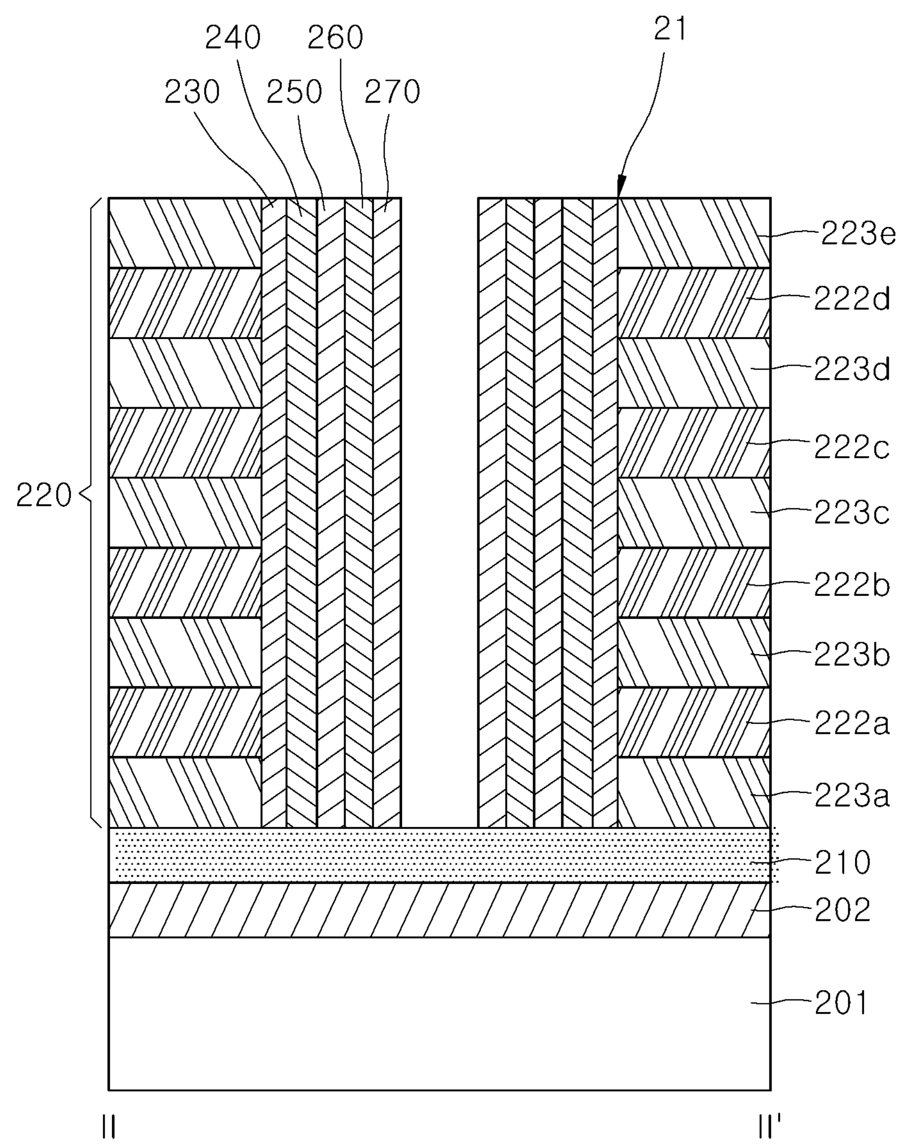
Figure 16A:
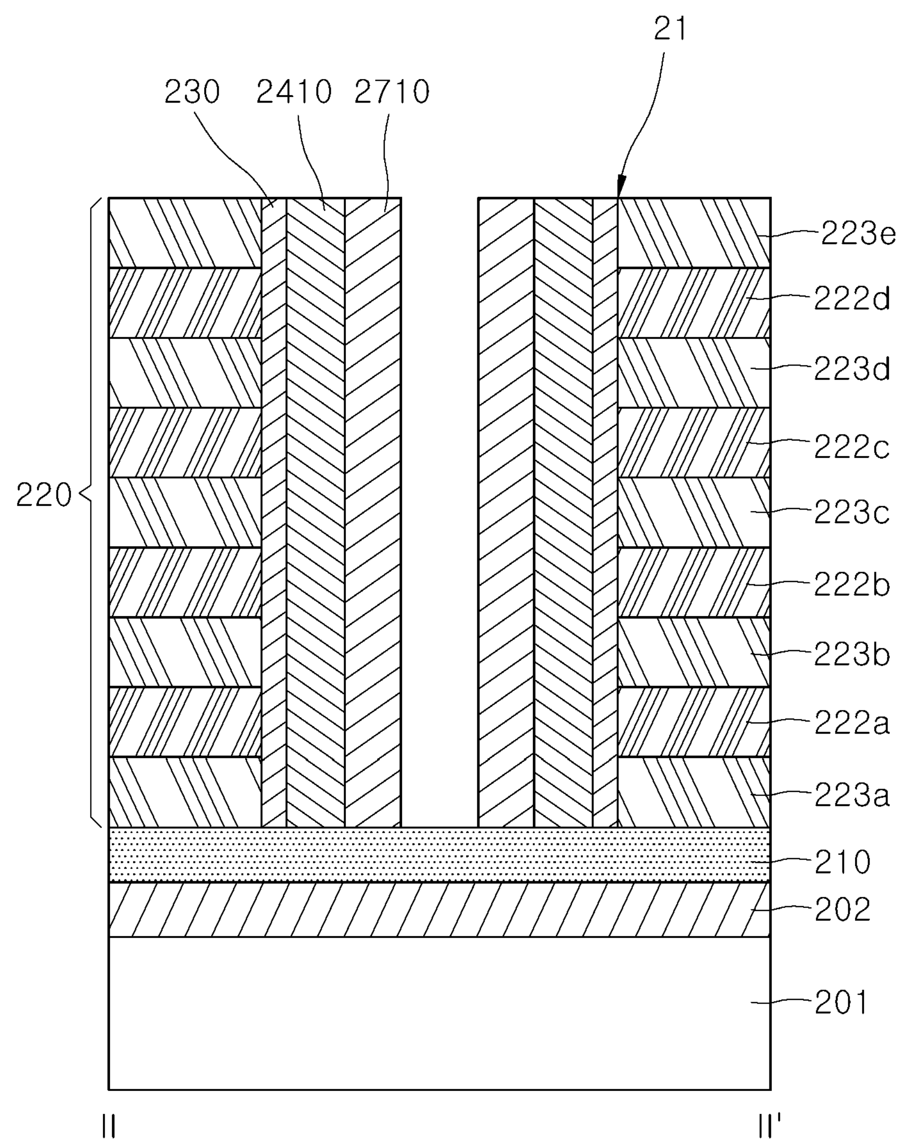
FIGS. 16A and 16B are cross-sectional views schematically illustrating a method of manufacturing a semiconductor device according to another embodiment of the present disclosure.
Figure 16B:
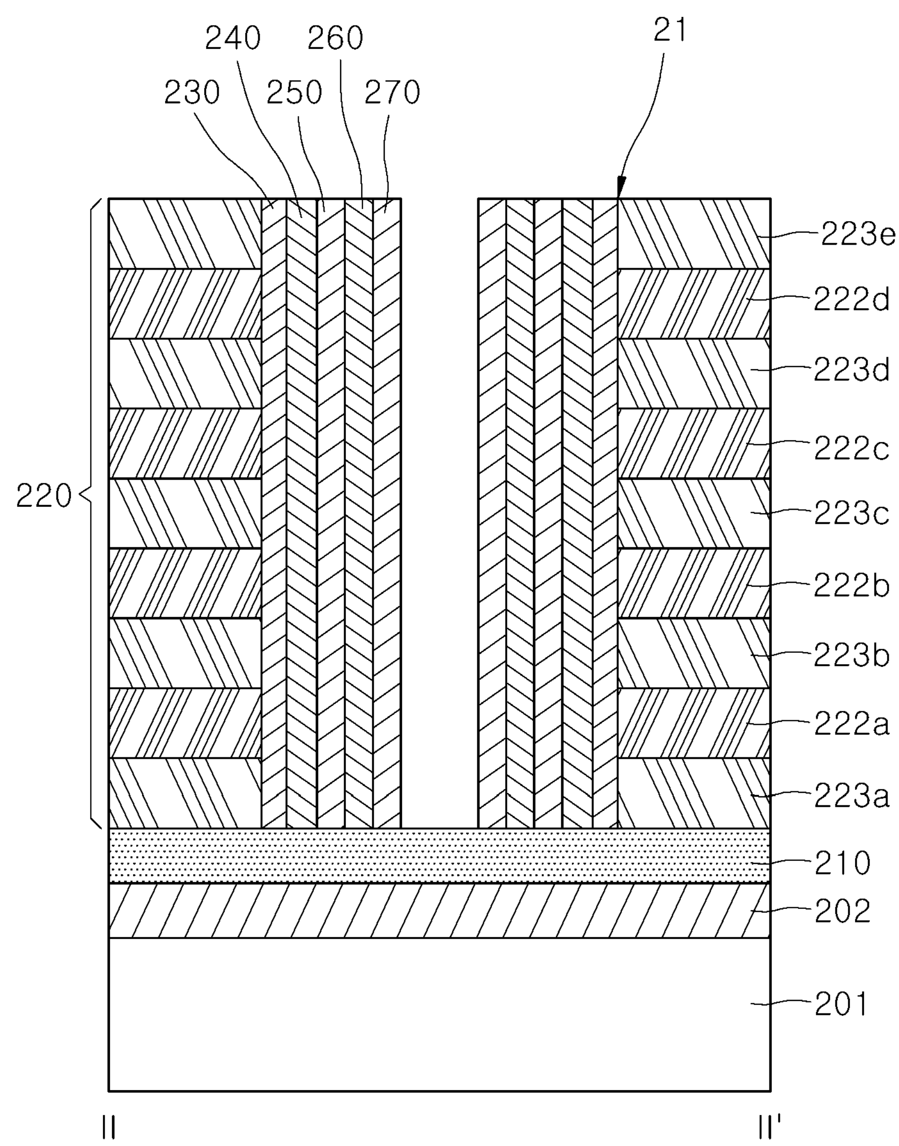

FIGS. 15A and 15B are cross-sectional views schematically illustrating a method of manufacturing a semiconductor device according to an embodiment of the present disclosure. FIGS. 16A and 16B are cross-sectional views schematically illustrating a method of manufacturing a semiconductor device according to another embodiment of the present disclosure.

Referring to FIG. 15A, a base insulating layer 202 and a channel lower contact layer 210 may be sequentially formed on a substrate 201. A gate structure 220 having a hole pattern 21 may be formed on the channel lower contact layer 210. Subsequently, a gate insulating layer 230, a channel layer 240, an oxidation reaction layer 2510, and a reduction reaction layer 2710 may sequentially be formed on a sidewall surface of the gate structure 220 located inside the hole pattern 21. The oxidation reaction layer 2510 and the reduction reaction layer 2710 may be substantially the same as the oxidation reaction layer 1510 and the reduction reaction layer 1710 described above with reference to FIG. 7A.

When the reduction reaction layer 2710 is formed on the oxidation reaction layer 2510, as described above with reference to FIGS. 7A and 7B, silicon (Si) or aluminum (Al) in the oxidation reaction layer 2510 may be combined with oxygen in the reduction reaction layer 2710 to form silicon oxide or aluminum oxide. Accordingly, the reduction reaction layer 270 may be partially reduced. In another embodiment, after the reduction reaction layer 2710 is formed on the oxidation reaction layer 2510, the redox reaction between the oxidation reaction layer 2510 and the reduction reaction layer 2710 may be promoted by further performing heat treatment.

Referring to FIG. 15B, the entire oxidation reaction layer (2510 of FIG. 15A) may be oxidized and converted into a resistor layer 250. A portion of the reduction reaction layer (2710 of FIG. 15A) reduced by the reaction with the oxidation reaction layer 2510 may form the resistance changing layer 260. The resistance changing layer 260 may include oxygen vacancies resulting from a deficiency of oxygen. A portion of the reduction reaction layer 2710 that does not participate in the reaction with the oxidation reaction layer 2510 may remain to form the insulating layer 270. Subsequently, although not illustrated in FIG. 15B, the hole pattern 21 may be filled by a filling layer. Subsequently, a channel upper contact layer and a bit line may be formed outside the hole pattern 21. The above-described method may be performed with respect to the hole pattern 22 of FIG. 9. As a result, a semiconductor device 2 described above with reference to FIGS. 9 to 11 may be manufactured.

In some embodiments, after filling the hole pattern 21 by using the filling layer, a trench pattern extending in a direction across a diameter of the hole pattern 21 in the y-direction may be formed on the channel lower contact layer 210. By filling the trench pattern with an insulating material, a cell insulating structure may be formed. Subsequently, a channel upper contact layer and a bit line may be formed outside the hole pattern 21. As a result, a semiconductor device 3 described with reference to FIGS. 13 and 14 may be manufactured.

In some embodiments, after the resistance changing layer 260 is formed, the remaining insulating layer 270 may be removed. Subsequently, the hole pattern 21 may be filled by a filling layer and the filling layer may contact the resistance changing layer 260. Subsequently, a channel upper contact layer and a bit line may be formed outside the hole pattern 21. As a result, as a modification of a semiconductor device 2 described above with reference to FIGS. 9 to 11, a different semiconductor device in which the insulating layer 270 is omitted may be manufactured.

In some embodiments, in the process of forming the resistance changing layer 260 of FIGS. 15A and 15B, the resistance changing layer 260 may further include silicon (Si) or aluminum (Al) diffused into the resistance changing layer 260 from the oxidation reaction layer 2510. The diffused silicon (Si) or aluminum (Al) may additionally reduce the metal oxide in the resistance changing layer 260. Due to the reduction of the metal oxide, the oxygen vacancy concentration in the resistance changing layer 260 may be additionally increased.

FIGS. 16A and 16B are cross-sectional views schematically illustrating a method of manufacturing a semiconductor device according to another embodiment of the present disclosure. In an embodiment, the method described with reference to FIGS. 16A and 16B may be applied to a semiconductor device 2 of FIGS. 9 to 11 and a semiconductor device 3 of FIGS. 13 and 14.

Referring to FIG. 16A, a base insulating layer 202 and a channel lower contact layer 210 may be sequentially formed on a substrate 201. A gate structure 220 having a hole pattern 21 may be formed on the channel lower contact layer 210.

Subsequently, a gate insulating layer 230, a channel formation layer 2410, and a reduction reaction layer 2710 may be sequentially formed on a sidewall surface of the gate structure 220, located inside the hole pattern 21.

The channel formation layer 2410 may include a semiconductor material. A configuration of the channel formation layer 2410 may be substantially the same as that of the channel formation layer 1410 described above with reference to FIG. 8A. The reduction reaction layer 2710 may include a metal oxide. The oxygen affinity of the semiconductor material of the channel formation layer 2410 may be greater than that of the metal in the metal oxide of the reduction reaction layer 2710.

In an embodiment of the present disclosure, when the reduction reaction layer 2710 is formed on a channel formation layer 2410 that includes silicon (Si), a portion of the channel formation layer 2410 and a portion of the reduction reaction layer 2710 may react with each other. That is, a portion of the channel formation layer 2410 may be oxidized to silicon oxide, and a portion of the reduction reaction layer 2710 may be reduced. In another embodiment, after the reduction reaction layer 2710 is formed on the channel formation layer 2410, the redox reaction between the channel formation layer 2410 and the reduction reaction layer 2710 may be promoted by further performing heat treatment.

As a result, as illustrated in FIG. 16B, the oxidized portion of the channel formation layer 2410 may form a resistor layer 250. The portion of the channel formation layer 2410 that is not oxidized may form the channel layer 240. The portion of the reduction reaction layer 2710 reduced by the reaction with the channel formation layer 2410 may include metal oxide that is deficient in oxygen (i.e., metal oxide having oxygen vacancies). The reduced portion may form the resistance changing layer 260. The portion of the reduction reaction layer 2710 that does not participate in the reaction with the channel formation layer 2410 may remain to form the insulating layer 270. Subsequently, the hole pattern 21 may be filled with an insulating material to form a filling layer (not illustrated). As a result, a semiconductor device 2 described with reference to FIGS. 9 to 11 may be manufactured.

In some embodiments, after filling the hole pattern 21 with the filling layer, a trench pattern extending in a direction crossing a diameter of the hole pattern 21 may be formed on the channel lower contact layer 210. A cell insulating structure may be formed by filling the trench pattern with an insulating material. Subsequently, a channel upper contact layer and a bit line may be formed outside the hole pattern 21. As a result, a semiconductor device 3 described with reference to FIGS. 13 and 14 may be manufactured.

Figure 17:
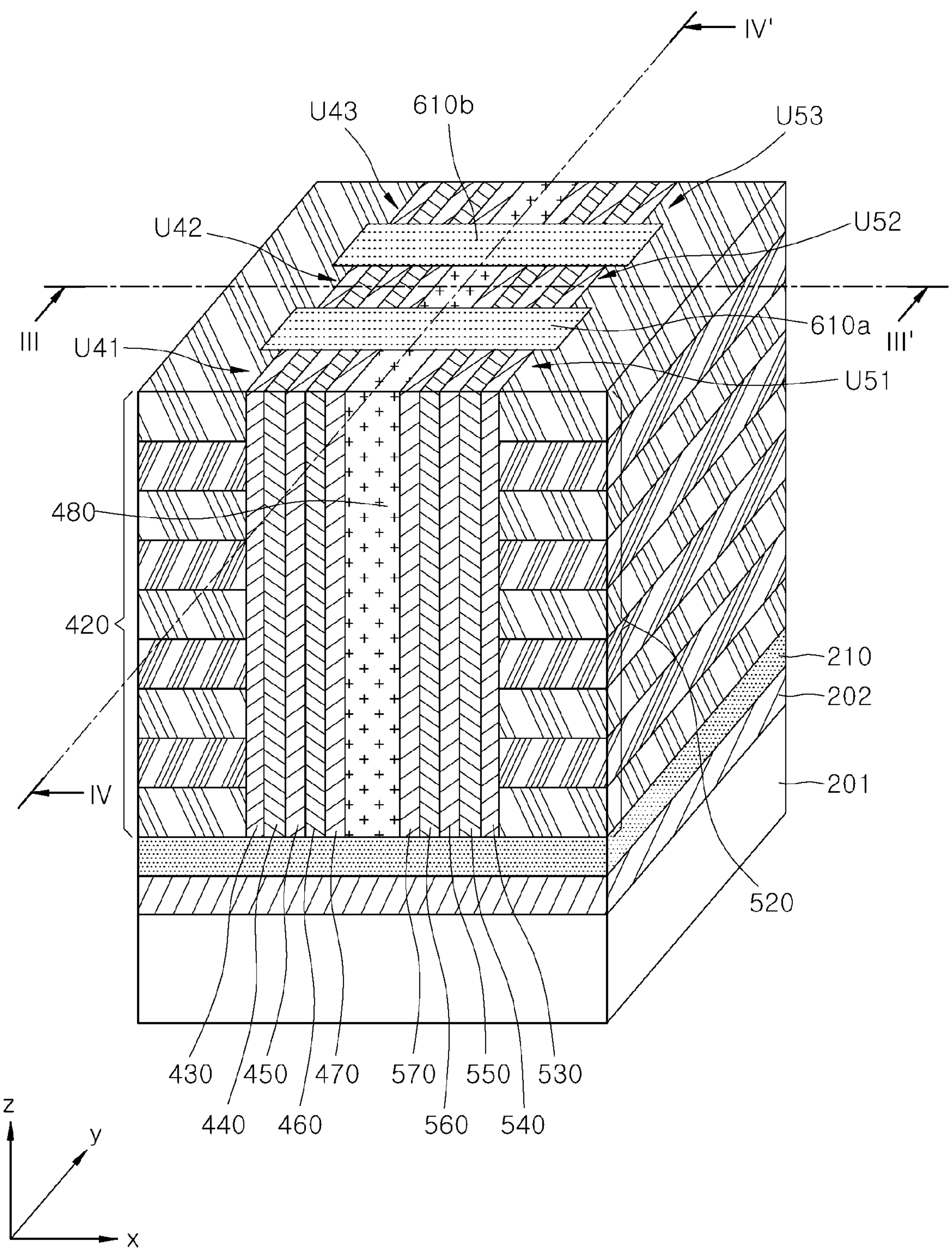
FIG. 17 is a perspective view schematically illustrating a semiconductor device according to yet another embodiment of the present disclosure.
Figure 18:
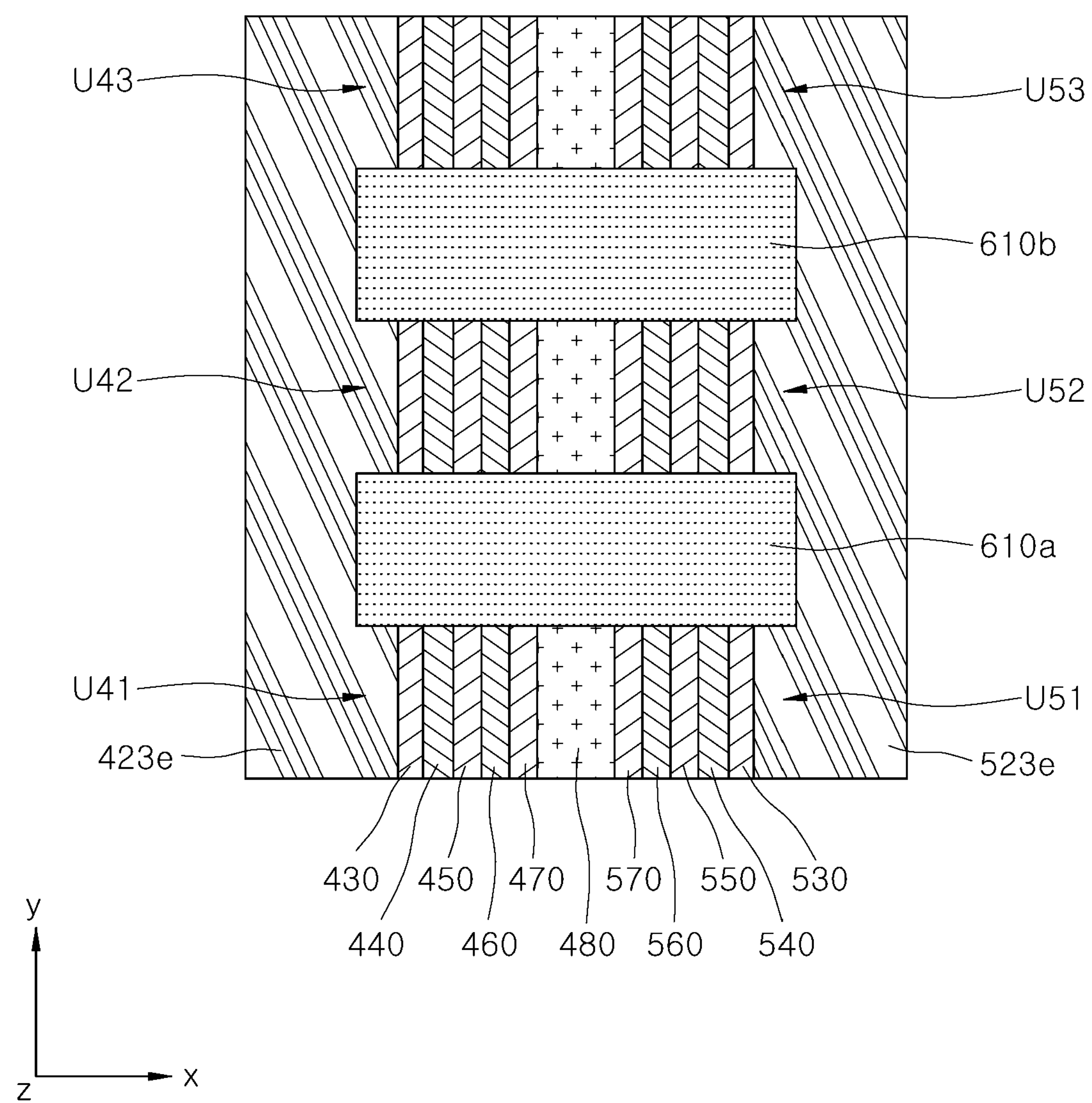
FIG. 18 is a plan view of the semiconductor device of FIG. 17.
Figure 19:
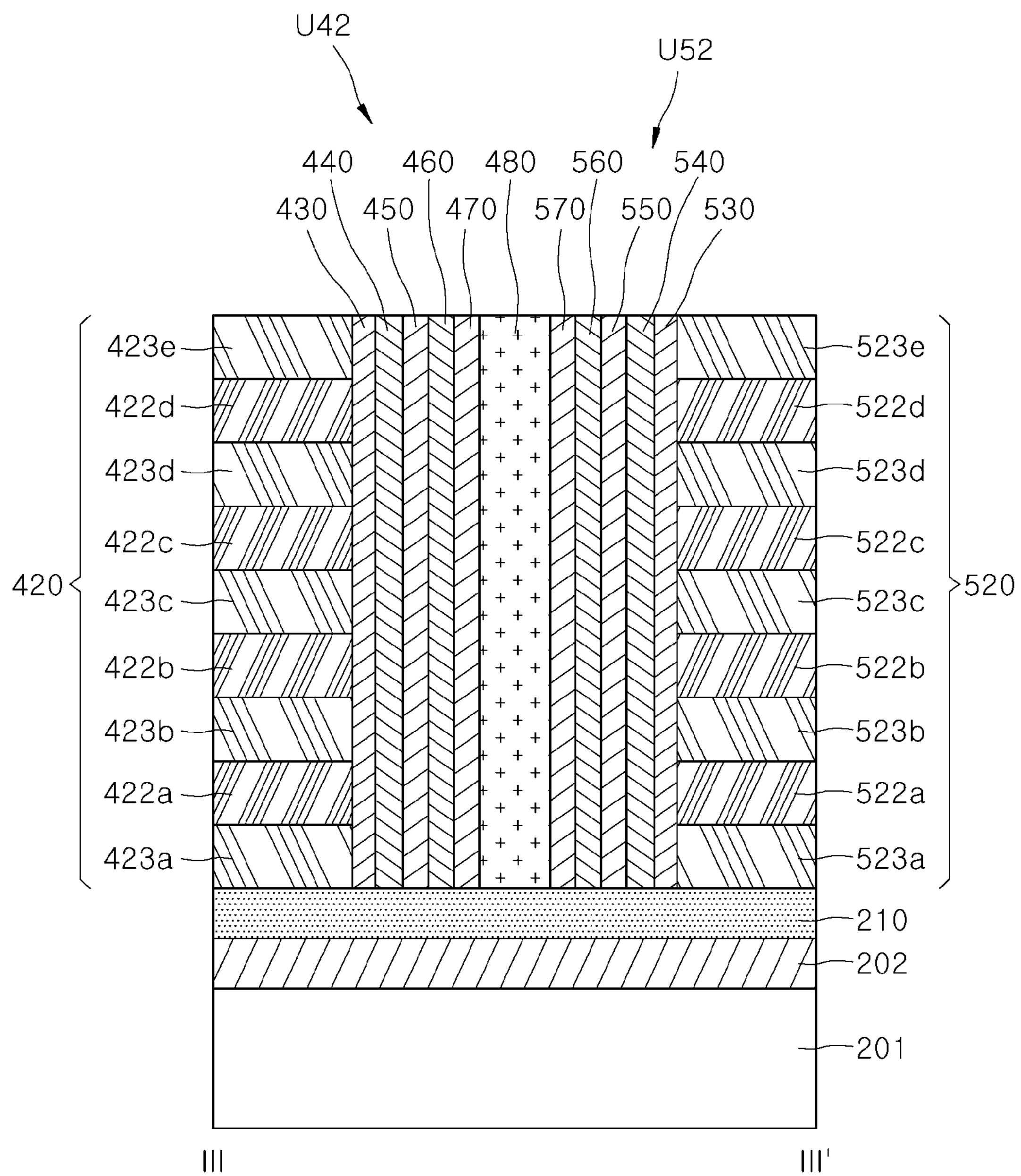
FIG. 19 is a cross-sectional view taken along line III-III' of the semiconductor device of FIG. 17.
Figure 20:
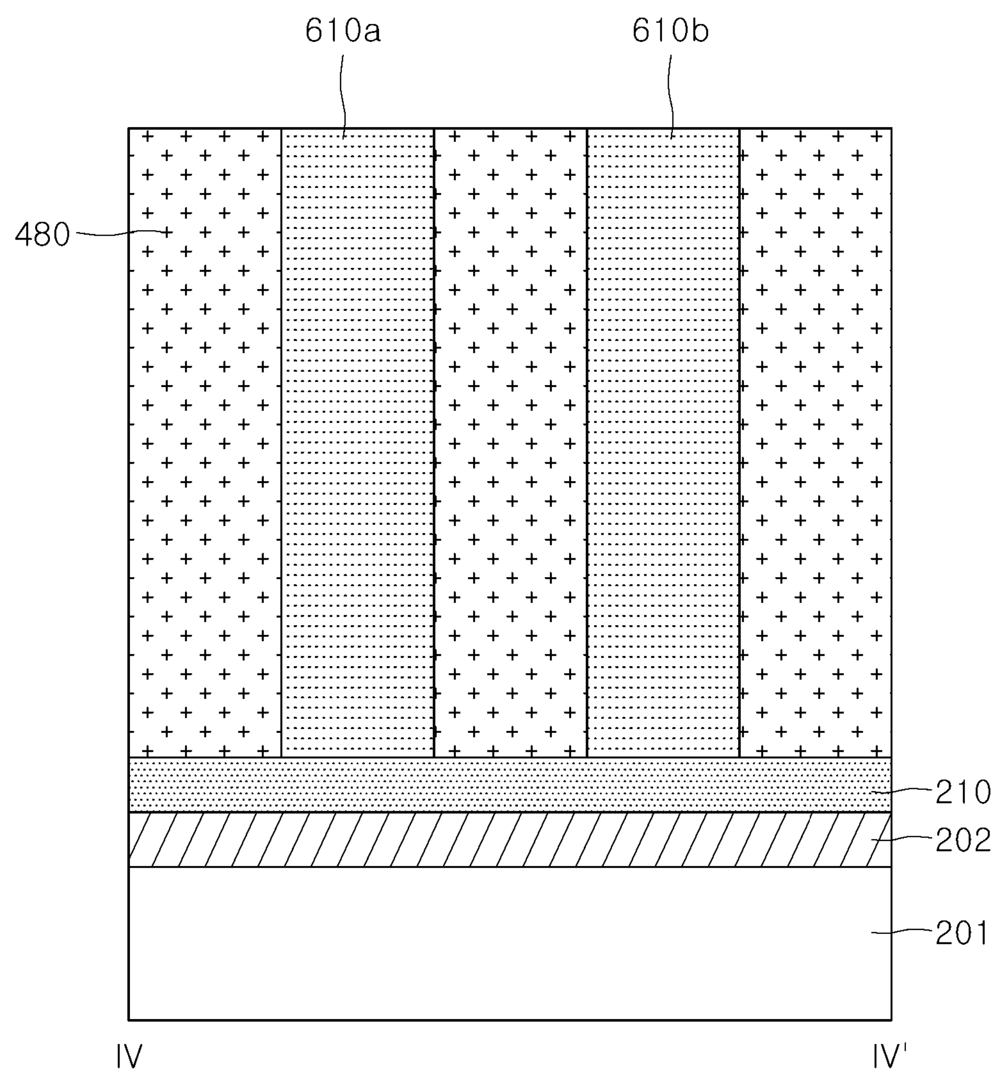
FIG. 20 is a cross-sectional view taken along line IV-IV' of the semiconductor device of FIG. 17.

FIG. 17 is a perspective view schematically illustrating a semiconductor device according to yet another embodiment of the present disclosure. FIG. 18 is a plan view of the semiconductor device of FIG. 17. FIG. 19 is a cross-sectional view taken along a line III-III' of the semiconductor device of FIG. 17. FIG. 20 is a cross-sectional view taken along a line IV-IV' of the semiconductor device of FIG. 17.

Referring to FIGS. 17 to 20, a semiconductor device 4 may include a substrate 201 and first and second gate structures 420 and 520, which are disposed over the substrate 201. The first and second gate structures 420 and 520 may extend parallel to each other in a second direction (i.e., y-direction). The semiconductor device 4 may include a gate insulating layer 430, a channel layer 440, a resistor layer 450, a resistance changing layer 460, and an insulating layer 470 that are sequentially disposed on a sidewall surface of the first gate structure 420 over the substrate 201. In addition, the semiconductor device 4 may include a gate insulating layer 530, a channel layer 540, a resistor layer 550, a resistance changing layer 560, and an insulating layer 570 that are sequentially disposed on a sidewall surface of the second gate structure 520 over the substrate 201.

Referring to FIGS. 17 to 20, a base insulating layer 202 and a channel lower contact layer 210 may be sequentially disposed on the substrate 201.

The first gate structure 420 may be disposed on the channel lower contact layer 210. The first gate structure 420 may include first to fourth gate electrode layers 422*a*, 422*b*, 422*c*, and 422*d* and first to fifth interlayer insulating layers 423*a*, 423*b*, 423*c*, 423*d*, and 423*e* that are alternately stacked along a first direction (i.e., z-direction) perpendicular to the substrate 201. The first gate structure 420 may extend in a second direction (i.e., y-direction) perpendicular to the first direction (i.e., z-direction).

Each of the first to fourth gate electrode layers 422*a*, 422*b*, 422*c*, and 422*d* may include a conductive material. The conductive material of the first to fourth gate electrode layers 422*a*, 422*b*, 422*c*, and 422*d* may be substantially the same as the conductive material of the first to fourth gate electrode layers 222*a*, 222*b*, 222*c*, and 222*d* of the semiconductor device 2 described above with reference to FIGS. 9 to 11. Each of the first to fifth interlayer insulating layers 423*a*, 423*b*, 423*c*, 423*d*, and 423*e* may include an insulating material. The insulating material of the first to fifth interlayer insulating layers 423*a*, 423*b*, 423*c*, 423*d*, and 423*e* may be substantially the same as the insulating material of the first to fifth interlayer insulating layers 223*a*, 223*b*, 223*c*, 223*d*, and 223*e* of the semiconductor device 2 described above with reference to FIGS. 9 to 11.

Likewise, the second gate structure 520 may be disposed on the channel lower contact layer 210. The second gate structure 520 may include first to fourth gate electrode layers 522*a*, 522*b*, 522*c*, and 522*d* and first to fifth interlayer insulating layers 523*a*, 523*b*, 523*c*, 523*d*, and 523*e* that are alternately stacked along the first direction (i.e., z-direction) perpendicular to the substrate 201. Configurations of the first to fourth gate electrode layers 522*a*, 522*b*, 522*c*, and 522*d* and the first to fifth interlayer insulating layers 523*a*, 523*b*, 523*c*, 523*d*, and 523*e* of the second gate structure 520 may be substantially the same as those of the first to fourth gate electrode layers 422*a*, 422*b*, 422*c*, and 422*d* and the first to fifth interlayer insulating layers 423*a*, 423*b*, 423*c*, 423*d*, and 423*e* of the first gate structure 420.

In some embodiments, the numbers of the gate electrode layers of the first and second gate structures 420 and 520 might not be limited to four. The gate electrode layers may be arranged in different numbers, and the interlayer insulating layer may insulate the various numbers of gate electrode layers from each other along the first direction (i.e., z-direction).

Referring to FIGS. 17 to 20, the gate insulating layer 430, the channel layer 440, the resistor layer 450, the resistance changing layer 460, and the insulating layer 470, which are sequentially disposed on a sidewall surface of the first gate structure 420 on the channel lower contact layer 210, may be respectively disposed on a plane parallel to the y-z plane. Likewise, the gate insulating layer 530, the channel layer 540, the resistor layer 550, the resistance changing layer 560, and the insulating layer 570, which are sequentially disposed on a sidewall surface of the second gate structure 520 on the channel lower contact layer 210, may be respectively disposed on a plane parallel to the y-z plane.

The material compositions of the gate insulating layers 430 and 530, the channel layers 440 and 540, the resistor layers 450 and 550, the resistance changing layers 460 and 560, and the insulating layers 470 and 570 may be substantially the same as those of the gate insulating layer 230, the channel layer 240, the resistor layer 250, the resistance changing layer 260, and the insulating layer 270 described above with reference to FIGS. 9 to 11.

First and second cell insulating structures 610*a* and 610*b* may be disposed on the channel lower contact layer 210. The first and second cell insulating structures 610*a* and 610*b* may be disposed on the substrate 201 to be spaced apart from each other along a second direction (i.e., y-direction). The first and second cell insulating structures 610*a* and 610*b* may extend in a third direction (i.e., the x-direction) perpendicular to the first and second directions to separate or divide each of the gate insulating layers 430 and 530, each of the channel layers 440 and 540, each of the resistor layers 450 and 550, each of the resistance changing layers 460 and 560, and each of the insulating layers 470 and 570 in the second direction (i.e., y-direction).

Accordingly, the semiconductor device 4 may include first to sixth memory units U41, U42, U43, U51, U52, and U53, which are separated from each other by the first and second cell insulating structures 610*a* and 610*b*.

Although not illustrated, first to sixth bit lines connect to the first to sixth memory units U41, U42, U43, U51, U52, and U53, respectively. The first to sixth bit lines may be electrically connected to an end of each of the channel layers 440 and 540 of the first to sixth memory units U41, U42, U43, U51, U52, and U53, respectively. The other end of each of the channel layers 440 and 540 of the first to sixth memory units U41, U42, U43, U51, U52, and U53 may be electrically connected to a source line via the channel lower contact layer 210.

Methods of operating the first to sixth memory units U41, U42, U43, U51, U52, and U53 may be substantially the same as the operation method of the first and second memory units U21 and U22 of the semiconductor device described above with reference to FIGS. 9 to 11. That is, the operation method of the first to sixth memory units U41, U42, U43, U51, U52, and U53 may follow the circuit diagram described above with respect to FIG. 12.

The manufacturing of the semiconductor device 4 may be performed in the following order with reference to FIGS. 17 to 20. Specifically, the base insulating layer 202 and the channel lower contact layer 210 may be formed on the substrate 201. The first and second gate structures 420 and 520 may be formed on the channel lower contact layer 210. In this case, the first and second gate structures 420 and 520 may extend in a direction parallel to the surface of the substrate 201 (e.g., y-direction). In addition, each of the first and second gate structures 420 and 520 may include at least one gate electrode layer and an interlayer insulating layer that are alternately stacked in a direction (e.g., z-direction) perpendicular to the surface of the substrate 201. Subsequently, the gate insulating layers 430 and 530, the channel layers 440 and 540, and the oxidation reaction layer may be sequentially formed on a sidewall surface of each of the first and second gate structures 420 and 520 on the channel lower contact layer 210. A reduction reaction layer may be formed on the oxidation reaction layer. Subsequently, the oxidation reaction layer and the reduction reaction layer may react to form the resistor layers 450 and 550, the resistance changing layers 460 and 560, and the insulating layers 470 and 570.

The processes of forming the gate insulating layers 430 and 530, the channel layers 440 and 540, the oxidation reaction layer, and the reduction reaction layer, and the process of forming the resistor layers 450 and 550, the resistance changing layers 460 and 560 and the insulation layers 470 and 570 by reacting the oxidation reaction layer and the reduction reaction layer may be substantially the same as the corresponding processes of the manufacturing method described above with reference to FIGS. 15A and 15B.

Subsequently, the filling layer 480 fills a space between the insulating layers 470 and 570, and the first and second cell insulating structures 610*a* and 610*b* may be formed.

In some embodiments, after forming the first and second gate structures 420 and 520 on the channel lower contact layer 210, the gate insulating layers 430 and 530 and the channel formation layer may be sequentially formed on a sidewall surface of each of the first and second gate structures 420 and 520. Subsequently, the reduction reaction layer may be formed on the channel formation layer. The channel formation layer and the reduction reaction layer may react to form the channel layers 440 and 540, the resistor layers 450 and 550, the resistance changing layers 460 and 560, and the insulating layers 470 and 570.

The processes of forming the gate insulating layers 430 and 530, the channel formation layer, and the reduction reaction layer, and the process of forming the channel layers 440 and 540, the resistor layers 450 and 550, the resistance changing layers 460 and 560, and the insulating layers 470 and 570 by reacting the channel formation layer and the reduction reaction layer may be substantially the same as the corresponding processes of the manufacturing method described above with reference to FIGS. 16A and 16B.

According to various embodiments of the present disclosure described above, a semiconductor device in which a resistance changing layer is disposed adjacent to a channel layer of a transistor may be provided. Through the on/off operation of the transistor, a set voltage and a reset voltage may be applied to both ends of the resistance changing layer. In addition, by controlling the distribution of oxygen vacancies in the resistance changing layer, the resistance state of the resistance changing layer may be reversibly changed between a low resistance state and a high resistance state. In addition, in various embodiments of the present disclosure, the resistance state of the resistance changing layer may be gradually switched according to an applied voltage by using a resistor layer adjacent to the resistance changing layer. As a result, the embodiments of the present disclosure may provide a semiconductor device capable of effectively storing a plurality of changeable electrical resistance states as signal information in the resistance changing layer.

Although described above with reference to the views and embodiments, those skilled in the art will be able to understand that various modifications and changes can be made to the embodiments disclosed in the present application without departing from the spirit of the present application described in the following claims.

What is claimed is:

1. A semiconductor device comprising;

a substrate;

a gate structure disposed over the substrate, the gate structure including at least one gate electrode layer and at least one interlayer insulating layer that are alternately stacked over the substrate;

a hole pattern penetrating the gate structure over the substrate; and a gate insulating layer, a channel layer, a resistor layer, and a resistance changing layer that are sequentially disposed on a sidewall surface of the gate structure within the hole pattern, wherein each of the resistor layer and the resistance changing layer is disposed opposite to the gate insulating layer, based on the channel layer.

2. The semiconductor device of claim 1, wherein the resistance changing layer includes oxygen vacancies that are movable under an electric field.

3. The semiconductor device of claim 1, wherein the resistance changing layer has an electrical resistance that changes depending on a distribution of oxygen vacancies inside the resistance changing layer.

4. The semiconductor device of claim 1, wherein the resistance changing layer includes a non-stoichiometric metal oxide and the metal oxide has an insufficient amount of oxygen to metal.

5. The semiconductor device of claim 4, wherein the metal oxide includes at least one selected from the group consisting of lithium oxide, titanium oxide, nickel oxide, copper oxide, manganese oxide, hafnium oxide, zirconium oxide, tungsten oxide, niobium oxide, and vanadium oxide.

6. The semiconductor device of claim 5, wherein the resistance changing layer further includes an impurity that bonds oxygen and the impurity includes silicon (Si) or aluminum (Al).

7. The semiconductor device of claim 1, wherein the resistor layer has invariable resistivity.

8. The semiconductor device of claim 1, wherein the resistor layer has a thickness of 1 nm to 5 nm.

9. The semiconductor device of claim 1, wherein the resistor layer includes silicon oxide or aluminum oxide.

10. The semiconductor device of claim 1, further comprising:

an insulating layer disposed to contact the resistance changing layer inside the hole pattern; and a filling layer disposed to contact the insulating layer and to fill the hole pattern.

11. The semiconductor device of claim 10, wherein the resistance changing layer and the insulating layer include the same metal oxide and the metal oxide of the resistance changing layer has a smaller amount of oxygen than the metal oxide of the insulating layer.

12. The semiconductor device of claim 10, further comprising a cell insulating structure disposed over the substrate that is connected to the filling layer and that bisects the hole pattern, wherein the cell insulating structure separates each of the gate structure, the gate insulation layer, the channel layer, the resistor layer, the resistance changing layer, and the insulation layer in a direction that crosses a diameter of the hole pattern.

13. The semiconductor device of claim 1, wherein ends of the channel layer are configured to be connected to a source line and a bit line, respectively.

14. A semiconductor device comprising;

a substrate;

a gate structure disposed over the substrate, the gate structure including at least one gate electrode layer and at least one interlayer insulating layer that are alternately stacked over the substrate along a first direction perpendicular to the substrate and extending in a second direction perpendicular to the first direction; and a gate insulating layer, a channel layer, a resistor layer, and a resistance changing layer sequentially disposed on a sidewall surface of the gate structure over the substrate, wherein each of the resistor layer and the resistance changing layer is disposed opposite to the gate insulating layer, based on the channel layer.

15. The semiconductor device of claim 14, further comprising an insulating layer disposed on the substrate to contact the resistance changing layer.

16. The semiconductor device of claim 15, wherein the resistance changing layer and the insulating layer include the same metal oxide, and the metal oxide of the resistance changing layer has a smaller amount of oxygen than the metal oxide of the insulating layer.

17. The semiconductor device of claim 16, further comprising a plurality of cell insulating structures disposed over the substrate to be spaced apart from each other along the second direction.

18. The semiconductor device of claim 17, wherein the plurality of cell insulating structures are disposed to extend in a third direction perpendicular to the first and second directions, and the plurality of cell insulating structures separate each of the gate insulating layer, the channel layer, the resistor layer, the channel layer, and the insulating layer.

19. The semiconductor device of claim 14, wherein the resistance changing layer includes oxygen vacancies movable under an applied electric field.

20. The semiconductor device of claim 14, wherein the resistance changing layer has an electrical resistance that changes depending on a distribution of oxygen vacancies inside the resistance changing layer, and wherein the resistor layer has fixed resistivity.

* * * * *